US 9,385,751 B2

(12) United States Patent
Kletter

(10) Patent No.: US 9,385,751 B2
(45) Date of Patent: Jul. 5, 2016

(54) ENHANCED DATA COMPRESSION FOR SPARSE MULTIDIMENSIONAL ORDERED SERIES DATA

(71) Applicant: Protein Metrics Inc., San Carlos, CA (US)

(72) Inventor: Doron Kletter, San Mateo, CA (US)

(73) Assignee: Protein Metrics Inc., San Carlos, CA (US)

( * ) Notice: Subject to any disclaimer, the term of this patent is extended or adjusted under 35 U.S.C. 154(b) by 0 days.

(21) Appl. No.: 14/877,875

(22) Filed: Oct. 7, 2015

(65) Prior Publication Data

US 2016/0099723 A1     Apr. 7, 2016

Related U.S. Application Data

(60) Provisional application No. 62/060,175, filed on Oct. 7, 2014.

(51) Int. Cl.
| | |
|---|---|
| *H03M 7/34* | (2006.01) |
| *H03M 7/30* | (2006.01) |
| *H03M 7/24* | (2006.01) |
| *H03M 7/42* | (2006.01) |

(52) U.S. Cl.
CPC .............. *H03M 7/3088* (2013.01); *H03M 7/24* (2013.01); *H03M 7/42* (2013.01)

(58) Field of Classification Search
CPC ..... H03M 7/3082; H03M 7/30; H03M 7/425; G10L 19/0017; G10L 19/008; H04W 88/181; H04W 4/001; H04W 4/02; H04W 4/025; H04W 4/027; H04W 4/028; H04W 4/20; H04W 8/22; G06F 17/30017; G06F 17/30743

USPC .................. 341/51, 65, 67, 87, 106, 107
See application file for complete search history.

(56) References Cited

U.S. PATENT DOCUMENTS

| | | | |
|---|---|---|---|
| 4,464,650 A | 8/1984 | Eastman et al. | |
| 4,558,302 A | 12/1985 | Welch | |
| 4,814,764 A | 3/1989 | Middleton | |
| 5,995,989 A | 11/1999 | Gedcke et al. | |
| 6,094,627 A | 7/2000 | Peck et al. | |
| 6,393,393 B1 * | 5/2002 | Kawahara | H04B 1/667 704/219 |
| 6,535,555 B1 * | 3/2003 | Bordes | H04N 19/176 348/420.1 |
| 6,798,360 B1 * | 9/2004 | Qian | H03M 7/3082 341/106 |
| 6,906,320 B2 | 6/2005 | Sachs et al. | |

(Continued)

FOREIGN PATENT DOCUMENTS

WO     WO2011/127544 A1     10/2011

OTHER PUBLICATIONS

Schreiber et al.; Using PeakView(TM) software with the XIC manager for screening and identification with high confidence based on high resolution and accurate mass LC-MS/MS; AB Sciex; Food & Environmental; (Pub. # 2170811-03); 5 pgs.; Apr. 2, 2011.

(Continued)

*Primary Examiner* — Linh Nguyen
(74) *Attorney, Agent, or Firm* — Shay Glenn LLP

(57) ABSTRACT

Disclosed are methods and systems for significantly compressing sparse multidimensional ordered series data comprised of indexed data sets, wherein each data set comprises an index, a first variable and a second variable. The methods and systems are particularly suited for compression of data recorded in double precision floating point format.

25 Claims, 11 Drawing Sheets

(56) References Cited

U.S. PATENT DOCUMENTS

| | | | |
|---|---|---|---|
| 7,006,567 B2* | 2/2006 | Frossard | H04N 19/649 375/240.03 |
| 7,283,684 B1 | 10/2007 | Keenan | |
| 7,283,937 B2 | 10/2007 | Goldberg | |
| 7,297,940 B2 | 11/2007 | Bern | |
| 7,400,772 B1 | 7/2008 | Keenan | |
| 7,402,438 B2 | 7/2008 | Goldberg | |
| 7,429,727 B2 | 9/2008 | Bern | |
| 7,496,453 B2 | 2/2009 | Chau | |
| 7,680,670 B2* | 3/2010 | Lamblin | H03M 7/3088 341/200 |
| 7,979,258 B2 | 7/2011 | Goldberg et al. | |
| 8,004,432 B2 | 8/2011 | Kawato | |
| 8,077,988 B2 | 12/2011 | Donoho | |
| 8,108,153 B2 | 1/2012 | Bern | |
| 8,428,889 B2 | 4/2013 | Wright | |
| 8,511,140 B2 | 8/2013 | Gorenstein et al. | |
| 8,598,516 B2 | 12/2013 | Sapargaliyev et al. | |
| 2002/0068366 A1 | 6/2002 | LaDine et al. | |
| 2003/0031369 A1* | 2/2003 | Le Pennec | G06T 9/007 382/232 |
| 2004/0102906 A1 | 5/2004 | Roder | |
| 2004/0160353 A1* | 8/2004 | Cirillo | G01S 7/003 342/25 R |
| 2005/0047670 A1* | 3/2005 | Qian | H04N 19/94 382/253 |
| 2008/0010309 A1* | 1/2008 | Sugita | H03M 7/30 |
| 2010/0124785 A1 | 5/2010 | Bern | |
| 2010/0288917 A1 | 11/2010 | Satulovsky et al. | |
| 2010/0288918 A1 | 11/2010 | Satulovsky | |
| 2011/0093205 A1 | 4/2011 | Bern | |
| 2012/0245857 A1 | 9/2012 | Lee et al. | |
| 2013/0080073 A1 | 3/2013 | de Corral | |
| 2013/0144540 A1 | 6/2013 | Bern et al. | |
| 2013/0226594 A1* | 8/2013 | Fuchs | G10L 19/0017 704/500 |
| 2013/0262809 A1* | 10/2013 | Wegener | G06F 12/08 711/165 |
| 2013/0275399 A1* | 10/2013 | Amit | G06F 17/30153 707/693 |
| 2013/0289892 A1 | 10/2013 | Satoh | |
| 2014/0045273 A1 | 2/2014 | Cerda et al. | |
| 2014/0164444 A1 | 6/2014 | Bowen et al. | |
| 2016/0077926 A1* | 3/2016 | Mutalik | G03F 11/1456 711/162 |

OTHER PUBLICATIONS

Thermo Fisher Scientific, Inc.; Thermo Xcaliber: Qualitative Analysis (User Guide); Revision B; 290 pgs.; Sep. 2010.

Valot et al.; MassChroQ: A versatile tool for mass spectrometry quantification; Proteomics; 11(17); 23 pgs.; Sep. 2011.

VanBramer; An Introduction to Mass Spectrometry; Wider University; 38 pgs.; ©1997; (revised) Sep. 2, 1998.

Yang et al.; Detecting low level sequence variants in recombinant monoclonal antibodies; mAbs 2 (3); pp. 285-298; May/Jun. 2010.

Ziv et al.; A universal algorithm for sequential data compression; IEEE Trans. on Information Theory; IT-23(3); pp. 337-343; May 1977.

Ziv et al.; Compression of individual sequences via variable-rate coding; IEEE Trans. on Information Theory; IT-24(5); pp. 530-536; Sep. 1978.

Becker et al.; U.S. Appl. No. 14/306,020 entitled "Interactive Analysis of Mass Spectrometry Data," filed Jun. 16, 2014.

* cited by examiner

ENHANCED DATA COMPRESSION FOR SPARSE MULTIDIMENSIONAL ORDERED SERIES DATA

CROSS REFERENCE TO RELATED APPLICATIONS

This application claims the benefit under 35 U.S.C. §119 of U.S. Patent Application No. 62/060,715, filed Oct. 7, 2014, titled "ENHANCED DATA COMPRESSION FOR SPARSE MULTIDIMENSIONAL ORDERED SERIES DATA". This application is herein incorporated by reference in its entirety.

INCORPORATION BY REFERENCE

All publications and patent applications mentioned in this specification are herein incorporated by reference in their entirety to the same extent as if each individual publication or patent application was specifically and individually indicated to be incorporated by reference.

FIELD

This invention relates to a systems and methods for compressing large data sets, and in particular spectroscopic data.
Introduction In many fields of science and technology, it is desired to obtain information about a subject by measuring a digital signal which represents that subject. As technology progresses, the sensitivity of sensors increases and the amount of data that can be obtained correspondingly increases. In particular, in many areas of science and engineering, such as in biology, chemistry, astronomy, physics, geology and object tracking, large quantities of spectroscopic data are often collected and stored. For example, mass spectrometry analysis frequently generates, within a few hours, single data sets that may be up to 30 GB or greater in size. Using currently available instruments, $10^4$ mass spectrometry datasets with $10^6$ data points and $10^6$ mass intensity values could be easily acquired, resulting in a raw file size of 4 TB.

The apparatuses and methods described herein address to the need to store and transfer large quantities of data which is particularly acute when dealing with spectroscopic data. The traditional approach to the problem has been to apply some sort of compression to the data in order to reduce the overall data size. In many situations it is often desirable to apply a form of lossless compression, the main advantage is that no information is lost during the compression, and the data can be precisely restored. However, the amount of compression that can be obtained with lossless compression is usually far lower than what is otherwise possible with lossy compression. Hence it is often acceptable to apply lossy compression in systems that can tolerate a limited amount of loss. The lossy compression in this context refers to a compression method in which the restored data, after decompression, may not be exactly the same as the original data entered for compression. As long as the absolute difference between the restored and original data—that is, the restoration error—is small enough, the situation may be acceptable in some systems. However, once loss is allowed, it is often difficult to guarantee the accuracy of the result. Therefore, lossy compression methods have been traditionally applied in situations where there is inherent redundancy in the data, for example, in image processing, where it is known that the eye is unable to notice high frequency variations in local neighborhoods, and filtering out the high frequency is desirable as a means for reducing the noise.

The conventional approach to the problem is to apply some type of a lossless or lossy compression, as the case may be, to the data at hand as a means for reducing the data size. There is a large body of compression algorithms in the literature, both proprietary and open source public domain. Commonly popular lossless algorithms include GZIP, LZW, 7ZIP, BZIP2, LZ4, LZMA, and ZLIB, to list a few. Anyone who uses computers is familiar with these existing compression methods, since the best ones, some of which have been around for years, have been adopted for native use by the operating systems. For example, ZLIB and BZIP2 are popular with Unix systems, while GZIP and 7ZIP are popular with Microsoft Windows. Yet there are numerous active ongoing research efforts to develop still better lossless compression algorithms.

A key property of the existing lossless compression methods is that they generally make no assumptions about the data to be compressed. The data can represent anything. In fact, many of the algorithms listed above treat the data as if it is comprised of a sequence of ASCII text data. These methods generally look for the longest repeating pattern of text strings nearby in a given window, and run length encode the distance to the pattern. The core algorithms behind many of these methods are based on the patented 1977 Lempel Ziv algorithm and other work-arounds available in the public domain. See e.g. U.S. Pat. Nos. 4,464,650; 4,814,764; and 4,558,302; Ziv, et al., IEEE Transactions of Information theory, Vol. IT-23, No. 3, 1977; and Ziv, et al. IEEE Transactions of Information Theory, Vol. IT-24, No. 5, 1978.

Since conventional compression methods make no assumptions about the underlying data, they generally are robust, and provide good compression with any type of data. The amount of compression, however, is variable depending on the content of the data. Highly redundant or more predictable data will tend to compress much more than random unpredictable data. In some situations, with particularly difficult noisy data, a few of the existing methods may actually increase the amount of data by up to 2- to 3-fold, instead of strictly compressing it. Some conventional methods are designed with a fall back to leave such data uncompressed, instead of attempting to compress and actually expanding it.

A wide variety of sensors and analyzers, e.g. radiation or x-ray detectors and spectrometers, accelerometers, mass spectrometers collect and store data using binary and double precision floating point values, in order to retain the highest possible accuracy. Large data sets obtained using such sensors often do not include repeating pattern of text strings that can be recognized and compressed utilizing the conventional compression systems. Accordingly, the need exists for methods and systems capable of compressing large data sets comprised of double precision floating point numbers that are otherwise not amenable to compression by conventional methods. Although the fundamental principle addressed by the methods and apparatuses described herein is the compression of data, the specific embodiments described and claimed herein apply this broad principle in a specific manner that is tailed to the problems uniquely faced by large sets of sparse multidimensional ordered series data, and specifically large sets of spectroscopic data.

SUMMARY OF THE DISCLOSURE

One aspect of the invention provides computer-implemented methods for compressing sparse multidimensional ordered series data, said method comprising (a) receiving sparse multidimensional ordered series data, wherein the data comprise indexed data sets, each indexed data set comprising an index (n), a first variable ($x_n$) and a second variable ($y_n$); (b) defining a predictor that calculates each first variable ($x_n$) as a function of the index (n); (c) assigning an amplitude code word to each $y_n$ based on the value and frequency of the $y_n$; (d) calculating a hop offset value ($\Delta n$) for each $y_n$; (e) assigning a hop code word to each $\Delta n$ based on the value and frequency of the $\Delta n$; and (f) generating a compressed output a decoder legend and code word data comprising an amplitude code word and a hop code word for each $y_n$ and each $\Delta n$, respectively. The compressed output comprises a description of the predictor; a reverse amplitude code word dictionary associated with $y_n$; and a reverse hop code word dictionary associated with $\Delta n$.

Another aspect provides non-transitory computer readable media having instructions stored therein, which, when executed by a process, cause the processor to perform operations, the operations comprising: receiving sparse multidimensional ordered series data, wherein the data comprise indexed data sets, each indexed data set comprising an index (n), a first variable ($x_n$) and a second variable ($y_n$); defining a predictor that calculates each first variable ($x_n$) as a function of the index (n); assigning an amplitude code word to each $y_n$ based on the value and frequency of the $y_n$; calculating a hop value ($\Delta n$) for each $y_n$ and assigning a hop code word to each $\Delta n$ based on the value and frequency of the $\Delta n$; and generating a compressed output comprising a decoder legend and code word data comprising an amplitude code word and a hop code word for each $y_n$ and each $\Delta n$, respectively. The decoder legend comprises a description of the predictor; a reverse amplitude code word dictionary associated with $y_n$; and a reverse hop code word dictionary associated with $\Delta n$.

Yet another aspect provides, ordered series data encoders comprising: a data receiver for receiving sparse multidimensional ordered series data, wherein the data comprise indexed data sets, each indexed data set comprising an index (n), a first variable ($x_n$) and a second variable ($y_n$); a predictor (e.g., predictor component) that predicts each first variable ($x_n$) as a function of the index (n); an amplitude coder (e.g., amplitude code component) that assigns an amplitude code word to each $y_n$ based on the value and frequency of the $y_n$; a hop coder (e.g., hop code component) that calculates a hop value ($\Delta n$) for each $y_n$ and assigns a hop code word to each $\Delta n$ based on the value and frequency of the $\Delta n$; and an encoder (e.g., encoder component) that generates a compressed output, said compressed output comprising a decoder legend and code word data comprising an amplitude code word and a hop code word for each $y_n$ and each $\Delta n$, respectively. The decoder legend comprises a description of the predictor; a reverse amplitude code word dictionary associated with $y_n$; and a reverse hop code word dictionary associated with $\Delta n$. In a preferred implementation, the ordered series is a time series.

Typically, the data of interest is collected by a set of sensors, cameras, and or a variety of instruments and devices. The devices can vary from common sensors such as velocity, accelerometers, and location positioning systems found in any smart phone to highly specialized instruments such as radiation or x-ray detectors. Regardless of the type of sensing device, the data typically is collected and stored using double precision floating point numbers, in order to retain the highest possible accuracy.

In some implementations, the sparse multidimensional ordered series data is in double precision floating point format. Preferably, the multidimensional ordered series data contain values that fall within a dynamic range of less than 10 orders of magnitude. In many implementations, the sparse multidimensional ordered series data, preferably time series data, comprises a plurality of indexed x,y pairs. In a preferred implementation, the sparse multidimensional ordered series data is mass spectrometry data, wherein x represents mass to charge ratio (m/z) and y represents signal intensity.

A high level of compression can be achieved when the first variable data is sparse. In some implementations, the first variable data is a smooth and slowly varying function of the index, such as illustrated for example in FIG. 5. A low-order polynomial predictor can be used to model and accurately predict the observed first variable ($x_n$) behavior. While defining the predictor, the predictor can be a global predictor function, a piecewise predictor, or a local predictor. The predictor can, optionally, comprise an error correction mechanism. Preferably when the predictor is a global predictor function, the predictor is an nth order polynomial function. In a preferred implementation, the predictor is the function, $g(n)=a0+a1*n+a2*n^2+a3*n^3$, wherein a0, a1, a2 and a3 are constants and n is the index.

A high level of compression can be achieved when the second variable data ($y_n$) is sparse. In some implementations, the second variable $y_n$ data is comprised of a sequence of variable amplitude measurements interspaced with intervals of relatively quiet periods during which the $y_n$ data remains moderately constant and primarily dominated by noise. Preferably, the second variable $y_n$ data is comprised of a non-uniform multi-modal distribution of amplitude ranges, where certain amplitude ranges that occur frequently are interspaced with other amplitude ranges that occur much less frequently. In some cases, the second variable $y_n$ data preferably is comprised of a discrete set of observable amplitude ranges interspaced with intervals of amplitude ranges that are not observed in the data.

In certain implementations, the step of assigning an amplitude code word to each $y_n$ based on the value and frequency of the $y_n$ comprises: (i) generating a hash table for amplitude values; and (ii) looking up each of the second variable ($y_n$) values in turn; (iii) sorting the list of amplitude values by their associated frequency occurrence; and (iv) assigning a unique amplitude code word to each unique amplitude value in the list of amplitude values, wherein the shortest code words are assigned to the most frequently occurring amplitude values. When looking up each of the second variable values, if the $y_n$ value is not previously seen, then the $y_n$ value is added to a list of amplitude values and an associated frequency occurrence is set to one. And if the $y_n$ is already present on the list of amplitude values, then the associated frequency occurrence is incremented by one. In a preferred implementation, any $y_n$ value less than or equal to a baseline threshold is skipped. In some implementations, assigning an amplitude code word to each $y_n$ can include assigning a single code word to represent two or more $y_n$ values.

In some implementations, the sparse multidimensional ordered series data describe a non-uniform multi-modal distribution of hop $\Delta n$ ranges, where certain hop ranges that are frequently and considerably more likely to occur are interspaced with other hop ranges that are much less likely to occur. In yet other (non-mutually exclusive) implementations, the hop offset values are comprised of a discrete set of observable amplitude ranges interspaced with intervals of amplitude ranges that are not observed in the data.

In certain implementations, the step of calculating a hop offset value ($\Delta n$) for each $y_n$ comprises: (i) identifying an initial hop offset value ($\Delta 0$) and entering the $\Delta 0$ into a previous register as a previous peak location; (ii) feeding each index (n) into the previous register subtracting the previous peak location from the index (n) to calculate the hop offset value ($\Delta n$) and then replacing the previous peak location with the index (n); and (iii) repeating step (ii) for each index (n) in the sparse multidimensional ordered series data. In an alternate implementation, the step of calculating a hop offset value ($\Delta n$) for each $y_n$ comprises: (i) identifying an initial hop offset value ($\Delta 0$) and entering the $\Delta 0$ into a previous register as a previous peak location; (ii) feeding each first variable ($x_n$) value, in turn, into the previous register subtracting the previous peak location from the $x_n$ value to calculate the hop offset value ($\Delta n$) and then replacing the previous peak location with the current $x_n$ value; and (iii) repeating step (ii) for each $x_n$ in the sparse multidimensional ordered series data.

In one implementation, the step of assigning a hop code word to each $\Delta n$ based on the value and frequency of the $\Delta n$ comprises: (i) generating a hash table for hop offset values; (ii) looking up each hop offset value ($\Delta n$) value in turn; (iii) sorting the list of hop values by their associated frequency occurrence; and (iv) assigning a unique hop code word to each unique hop value in the list of hop values, wherein the shortest code words are assigned to the most frequently occurring hop values. When looking up each hop offset value, if the $\Delta n$ value is not previously seen, then the $\Delta n$ value is added to a list of hop values and an associated frequency occurrence is set to one, and if the $\Delta n$ is already present on the list of hop values, then the associated frequency occurrence is incremented by one. In some implementations, assigning a hop code word to each $\Delta n$ can include assigning a single hope code word to represent two or more $\Delta n$ values.

Yet another aspect of the invention provides non-transitory readable media comprising compressed sparse multidimensional ordered series data, said compressed data comprising: a decoder legend and code word data comprising a plurality of pairs of an amplitude code word and a hop code word, wherein each pair of an amplitude code word and a hop code word, is capable of being decompressed to an index (n), a first variable ($x_n$) and a second variable ($y_n$). The decoder legend comprises a description of a predictor, wherein the predictor calculates a first variable ($x_n$) as a function of an index (n); a reverse amplitude dictionary, wherein the reverse amplitude dictionary includes a plurality of amplitude code words, wherein each amplitude code word is associated with an amplitude value; and a reverse hop offset dictionary, wherein the reverse hop offset dictionary associates a hop code word to each $\Delta n$ based on the value and frequency of the $\Delta n$. Preferably, the decoder legend further comprises an initial hop offset value ($\Delta_0$).

In general, the methods and apparatuses (e.g., software, firmware, hardware) described herein may be specifically tailored to the compression of sparse multidimensional ordered series of spectroscopic data. In particular, these compression techniques described herein may include components, such as predictors, encoders, and the like, that are specific for use with expected formats and values of mass spectroscopy data. For example, described herein are mass spectroscopy machines that have been modified to include software, hardware (see, e.g., FIG. 8 discussed in greater detail below) and/or firmware for encoding the large volumes of mass spectroscopy data recorded using the compression described herein. Such machines may therefore operate more efficiently, accurately, quickly and for a potentially shorter time, and may transmit and save, or even operate directly on, the resulting highly compressed data. For example, described herein are mass spectroscopy collection and/or analysis devices including a processor and a non-transitory computer readable medium having instructions stored therein, which, when executed by the process, cause the processor to: receive sparse multidimensional ordered series data, wherein the data comprise indexed data sets, each indexed data set comprising an index (n), a first variable ($x_n$) and a second variable ($y_n$) (where first variable ($x_n$) may represent a mass to charge ratio (m/z), and the second variable ($y_n$) may represent a signal intensity); define a predictor that calculates each first variable ($x_n$) as a function of the index (n); assign an amplitude code word to each $y_n$ based on the value and frequency of the $y_n$; calculate a hop value ($\Delta_n$) for each $y_n$ and assigning a hop code word to each $\Delta_n$ based on the value and frequency of the $\Delta_n$; and generate a compressed output, said compressed output comprising: a decoder legend comprising: a description of the predictor; a reverse amplitude code word dictionary associated with $y_n$; and a reverse hop code word dictionary associated with $\Delta n$; and code word data comprising an amplitude code word and a hop code word for each $y_n$ and each $\Delta_n$, respectively.

DETAILED DESCRIPTION

Described herein are computer-implemented methods for compressing sparse multidimensional ordered series data and specifically spectrographic data. These methods may generally include: (a) receiving sparse multidimensional ordered series data, wherein the data comprise indexed data sets, each indexed data set comprising an index (n), a first variable ($x_n$) and a second variable ($y_n$); (b) defining a predictor that calculates each first variable ($x_n$) as a function of the index (n); (c) assigning an amplitude code word to each $y_n$ based on the value and frequency of the $y_n$; (d) calculating a hop offset value ($\Delta n$) for each $y_n$; (e) assigning a hop code word to each $\Delta n$ based on the value and frequency of the $\Delta n$; and (f) generating a compressed output a decoder legend and code word data comprising an amplitude code word and a hop code word for each $y_n$ and each $\Delta n$, respectively. The compressed output comprises a description of the predictor; a reverse amplitude code word dictionary associated with $y_n$; and a reverse hop code word dictionary associated with $\Delta n$.

Unlike existing compression techniques, the method according to this invention may achieve order(s) of magnitude higher compression than is currently possible with conventional compression methods. The method is best suited for compressing double or single precision floating point data precisely of the type recorded by a variety of sensors and analyzers, such as spectrographic data. In stark contrast with existing compression techniques, which make no assumptions about the data, the present method achieves far higher compression ratio, precisely by taking advantage of the data structure and the fact that the data, for the most part, tends to be sparse in a particular and narrow sense, as described in greater detail below. This is not to say that there are few data points overall.

Instead of treating the data as ASCII text strings, which it isn't, and randomly looking for accidentally occurring patterns of strings, which are hardly expected to be consistent or even predictable, like existing compression methods, the method of this invention is designed to identify the likely aspects of data that are bound to be consistent and predictable, and proceed to jointly compress them in the most effective manner possible. Thus, the methods and apparatuses described herein are specifically tailored to the compression of the sparse multidimensional ordered series data is in double precision floating point format, such as in particular, spectrographic data.

Figure 2:
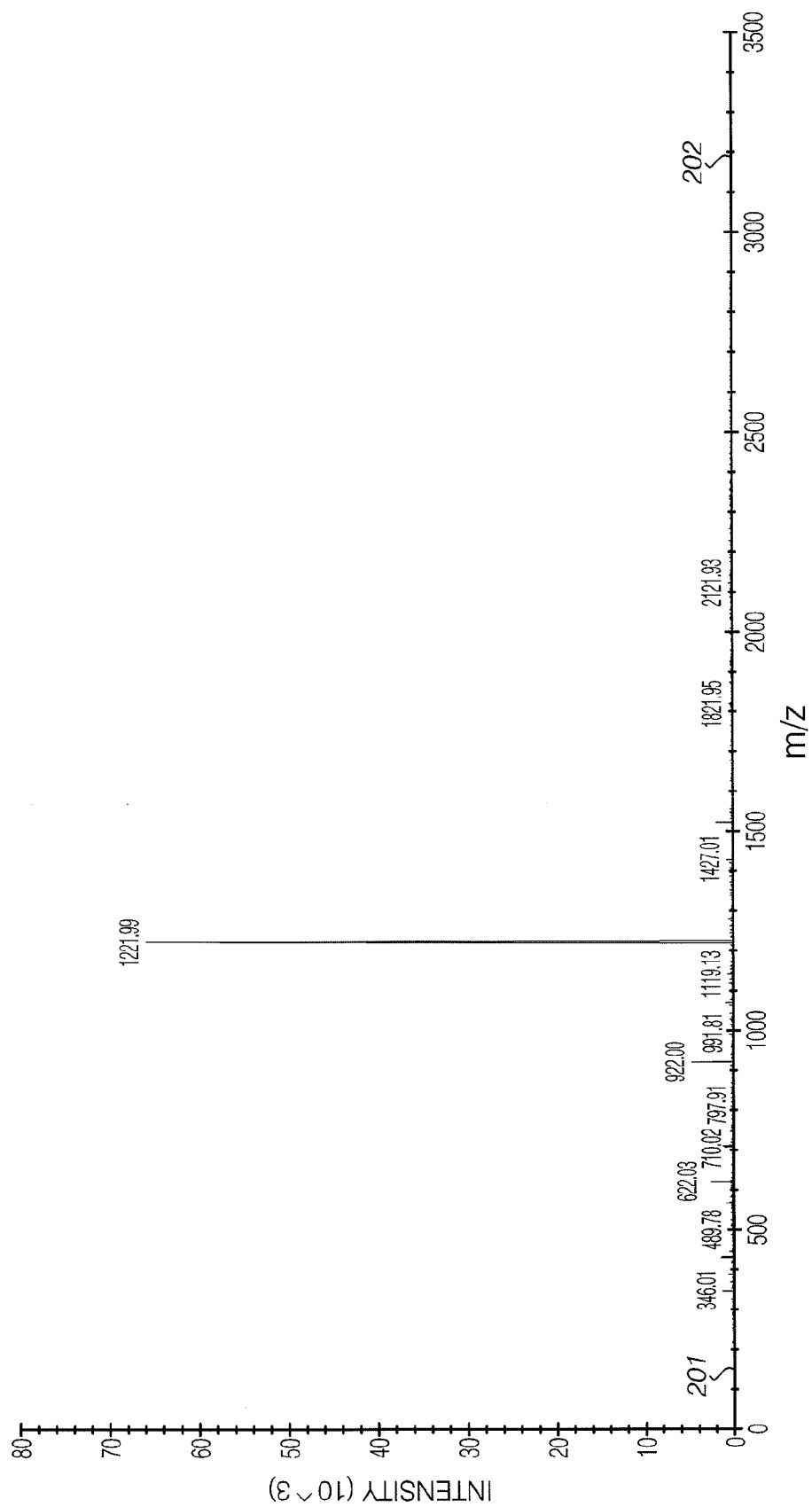
FIG. 2 provides an example of typical mass spectrometry data illustrating observed intensity or abundance as a function of mass divided by charge (m/z). Note that all data below approximately 190 m/z (region 201) and above approximately 2910 m/z (region 202) is zero or may not be recorded.

FIG. 2 shows an example of a typical ordered series data, recorded by a mass spectrometer. The recorded data represents one spectra of the relative intensity abundance of charged ions as a function of the mass to charge ratio (m/z). The horizontal axis in this figure is mass divided by charge m/z, and the vertical axis shows the observed intensity values. It should be noted that FIG. 2 is only an example, and the method of this invention is applicable to any type of data, including but not limited to data where the horizontal axis is a time axis, or a wavelength or frequency axis, as the case may be.

In a typical mass spectrometry experiment, a sample which may be solid, liquid, or gas, for instance a piece of cell tissue or a drop of blood, is vaporized by bombarding it with electrons or other means, such that the sample is ionized, and an electromagnetic field is applied to accelerate the charged ions and separate them according to their mass-to-charge ratio. Ions of the same mass-to-charge ratio will experience the same amount of deflection. Finally, the ions are detected by a detector that is capable of detecting charged particles. The results are usually displayed as spectra of the relative abundance of detected ions as a function of the mass-to-charge ratio. The molecular composition of the sample can then be identified from the characteristic fragmentation pattern, combined with the known elemental masses.

In each experiment, a mass spectrometer can produce many such spectra over time, resulting in a large quantity of data. A typical output in profile mode can readily exceed tens or even hundreds of GB of data from one single experiment (1 GB=$1.024 \times 10^9$ bytes). A mass spectrometer can be used in genomics and proteomics for sequencing genes and amino acid peptide chains, and for determining the molecular composition of chemical compounds, as well as for identifying abnormal disease patterns such as altered glycosylation in cancer.

Figure 3:
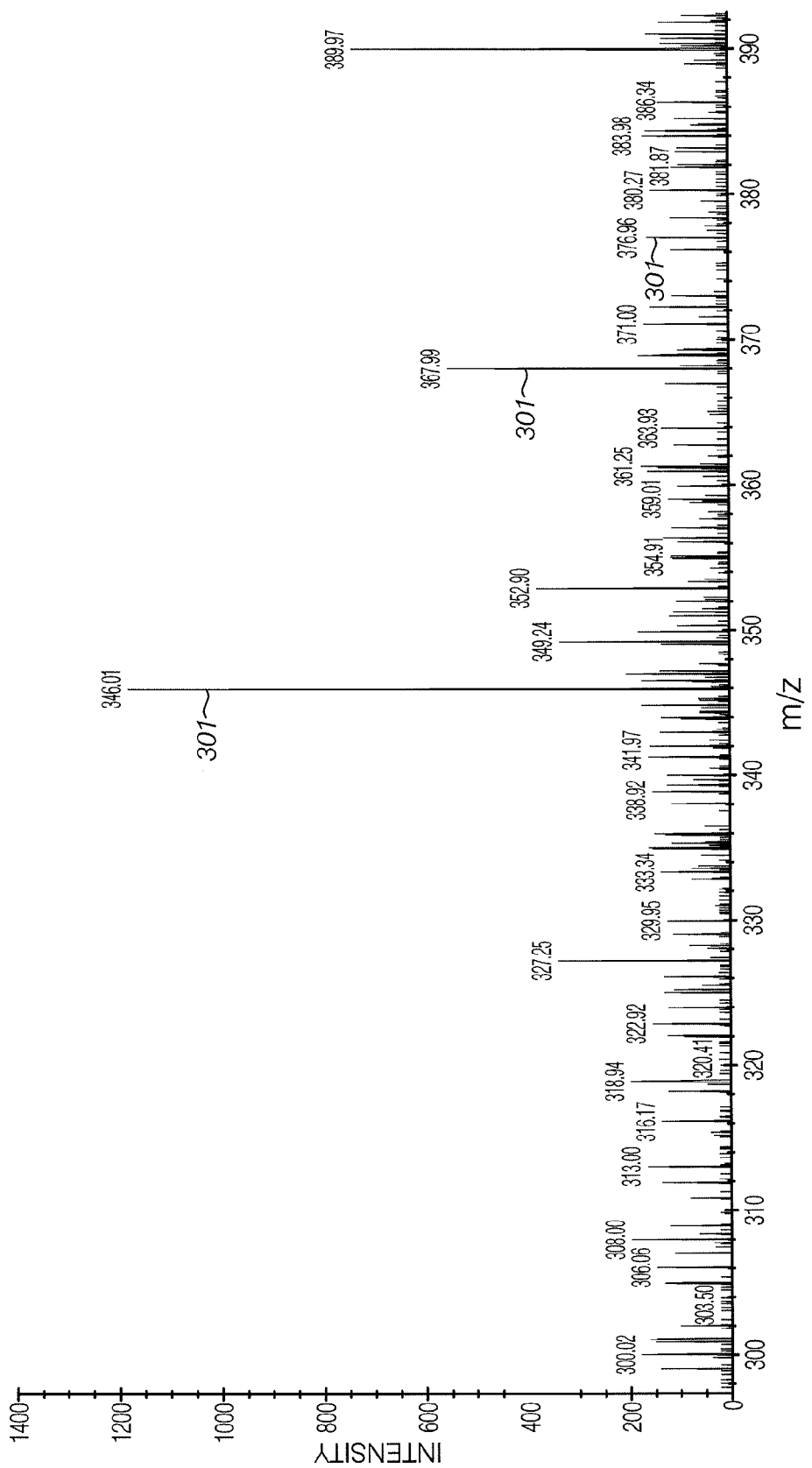
FIG. 3 provides a zoomed view of the observed data in FIG. 2 in the range of 300 to 390 m/z, illustrating the nature of the data, comprised of a dense series of peaks 301.

FIG. 3 shows a magnified view of the data in FIG. 2, expanded to show a region of the mass-to-charge ratio range from 300 to 390 m/z. As can be seen in FIG. 3, The output of the mass spectrometer in this example is comprised of a series of observed ion intensity abundance levels (vertical axis, or y data) as a function of the observed mass-to-charge ratio m/z (horizontal axis, or x data).

Figure 4:
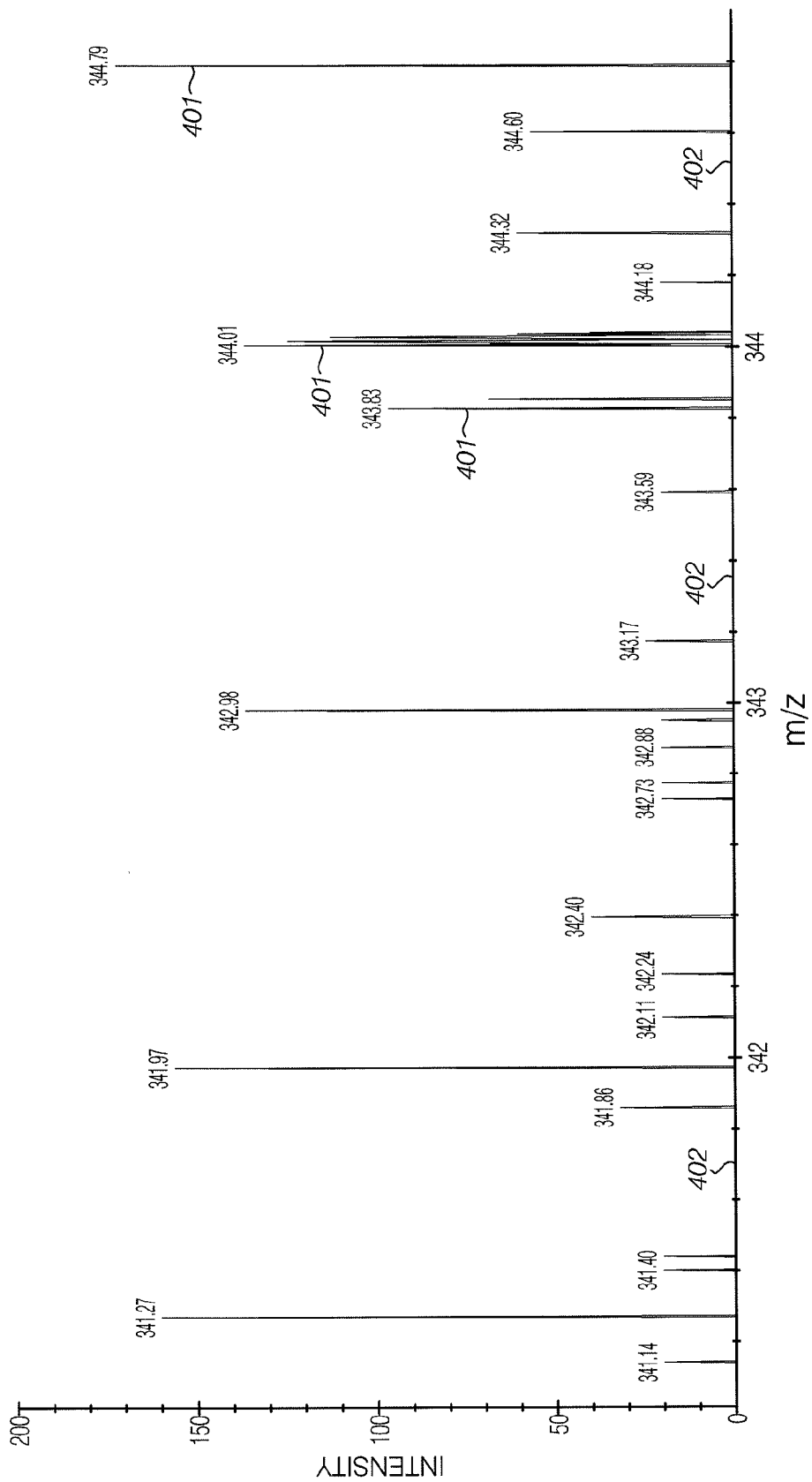
FIG. 4 provides a highly magnified region of the observed data of FIGS. 2 and 3 in the range of 341 to 345 m/z, illustrating the typical sparse data pattern; the data is comprised of a series of peaks of varying intensities at specific m/z locations.

FIG. 4 shown a further magnified view of the data in FIGS. 2 and 3, expanded to show a region of the mass-to-charge ratio range from 341 to 345 m/z. As can be seen more clearly in FIG. 4, the data is comprised of a series of peaks 401 of varying intensities at particular m/z locations. The data is said to be sparse when the intensity values in the regions 402 between peaks are set to a fixed constant value such as zero.

Each of the sequence of peaks in FIG. 4 is comprised of an (x, y) pair of double precision floating point numbers: the y-value is the observed intensity abundance, or the amplitude of a particular peak, and the x-value is the observed mass-to-charge ratio m/z. For example, the intensity abundance of the second peak is about 160.0, observed at a mass-to-charge ratio of about 341.2 m/z, as represented by the pair (341.2, 160.0) of double precision floating point numbers. The charged ions are trapped in an ion trap and released at particular times, at which point they travel under the influence of an electromagnetic field towards the detector, to be observed as a series of m/z values over time. Except for metadata and the experiment setup information, nearly all the data recorded is comprised of sequences of indexed paired double precision floating point numbers.

As one can readily appreciate, this type of data has nothing to do with ASCII sequences of text character strings, as currently assumed by most existing compression techniques. While any data can be viewed as a sequence of bytes and the bytes interpreted as text characters, the actual data content in this case is a sequence of floating point numbers, each floating point number is represented by a sign bit, mantissa, and exponent part, according to the IEEE 754 floating point industry standard. A single change in one of the least significant bits of the mantissa is probably numerically insignificant, while the byte in which it resides would altogether be interpreted as a different ASCII character by existing compression techniques.

Figure 1:
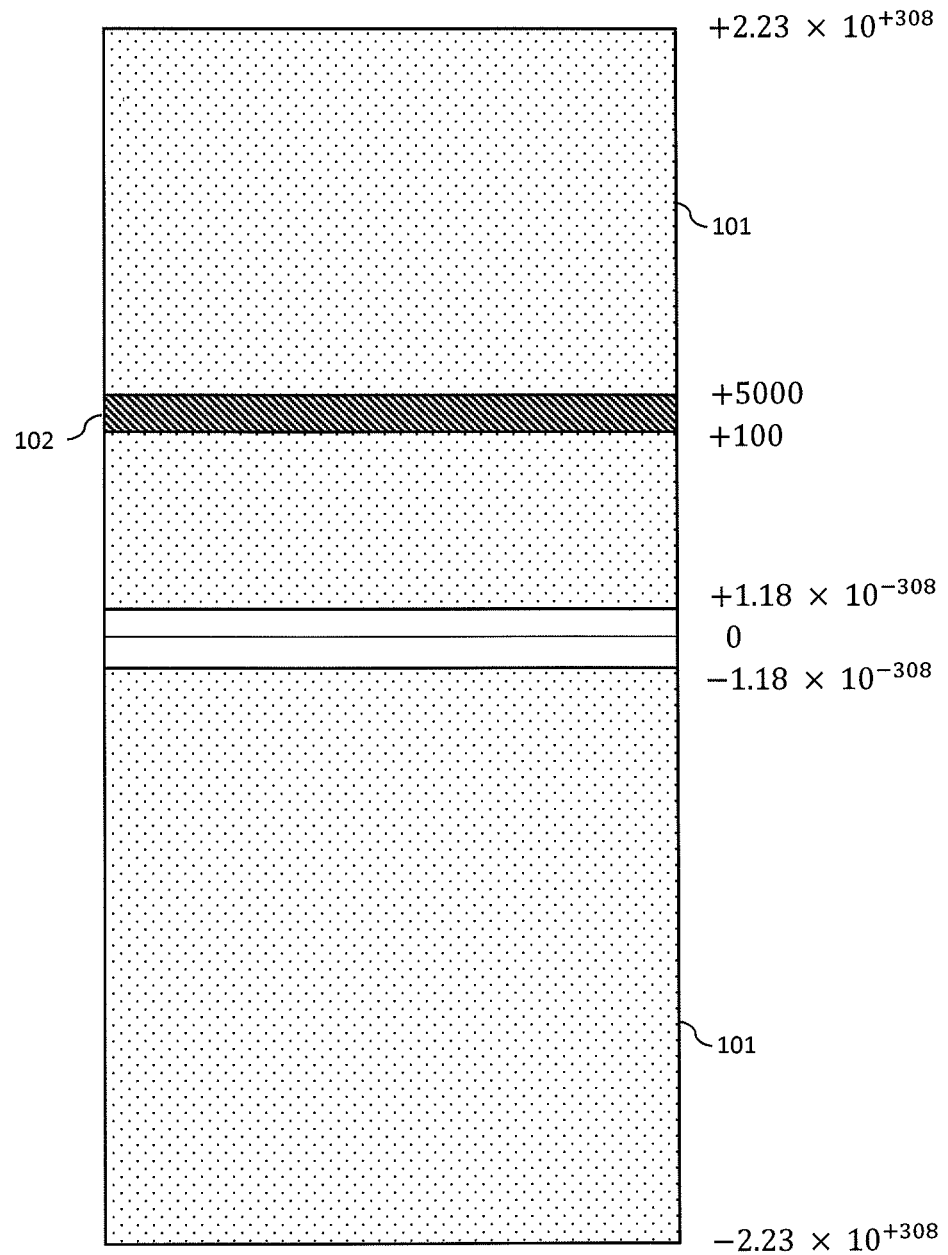
FIG. 1 illustrates the dynamic range of IEEE 754 industry standard double precision floating point numbers (dotted area 101) highlighting the observed signal range of a typical ordered series data series spanning the range of 100 to 5000 units (slanted lines 102).

FIG. 1 illustrates the dynamic range of the IEEE 754 industry standard double precision floating point numbers. The range of all the possible floating point numbers according to IEEE 754 is shown by dotted area 101, including zero. Each double precision floating point number is represented with a sign bit, a 52-bit mantissa, and 11-bit exponent part, altogether requiring 64-bits, or 8 bytes per double precision floating point number. The dynamic range of the data at full precision spans from $\pm 2.23 \times 10^{-308}$ to $\pm 1.80 \times 10^{308}$, with approximately 15 decimal digits of precision per value, and with over 600 orders of magnitude in scale.

In many practical situations, however, the observed input signal occupies only a small fraction of the dynamic range of the double floating point representation, usually just a few orders of magnitude at most. For example, the range of observed mass-to-charge ratio in most mass spectrometry cases varies between 100 and 5000 Dalton (a 1.5 orders of magnitude range). In the example shown in FIG. 2, for instance, the range is even smaller, only from 190 to 2910 m/z. The range of 100 to 5000 m/z is highlighted by the area 102 in FIG. 1. As can be appreciated in FIG. 1, the actual dynamic range 102 of the mass-to-charge ratio is but a tiny fraction of the representable floating point numbers range 101. Thus, the present invention is particularly suited to multidimensional ordered series data containing values that fall within a limited dynamic range within the native number system representation of the original data, typically within several orders of magnitude, while the native number representation is generally capable of representing a considerably wider range of many more orders of magnitude. For example, the multidimensional ordered series data contain values that fall within a dynamic range of ≤10 orders of magnitude, more preferably ≤8 orders of magnitude, and even more preferably ≤6 orders of magnitude.

One implementation of the method according to the present invention concentrates on the expected dynamic range of the observed signal, for example $x_n$, falls between 0 and 5000 m/z, and discards all the excess bits of information associated with the representation of numbers outside the observed signal range. Depending on user choice, the compression can be entirely lossless, or, alternatively, the user can choose to have higher compression while accepting a small loss of accuracy, for example 13 decimal digits instead of the maximum 15 decimal digits of precision. To illustrate, the accuracy with 13 decimal digits of precision would be less than ±0.000000001 Dalton for the highest mass-to-charge value of 5,000 Dalton in the example above, which is generally considered to be adequate in practice. Depending on the application, the user may trade off some precision in order to obtain higher compression.

Instead of attempting a loose interpretation of the data as ASCII text characters, and relying on a largely unpredictable chance of finding long matching sequences of text characters like conventional compression techniques, the method according to this invention takes advantage of a variety of characteristics common to many large data sets acquired by scientific and engineering equipment in order to achieve predictable and consistently superior compression.

First, instead of attempting to preserve the IEEE 754 floating point representation, the method of this invention identifies the observed dynamic range of the data, and discards all the excess bits of information associated with the representation of numbers outside the signal range. In other words, encoding only the region 102 where the observed data resides, instead of the entire much larger floating point region 101.

Second, the method described herein is specifically designed for compressing floating point data. The method takes advantage of knowing the data structure, instead of attempting to treat the data as an arbitrary collection of ASCII text characters like existing compression methods.

Third, instead of recording hundreds of thousands of floating point numbers in turn for each observed x or y value, the present method predicts the sequence of values of at least one of the axes, using either a local, a piecewise or a global predictor, and replaces the entire sequence of values with a small set of predictor coefficients optionally coupled with a small stream of local error feedback corrections. The ability to accurately replace hundreds of thousands of subsequent (non-linear) double precision floating point values (8 bytes each) with just a description of a predictor, e.g., a set of predictor coefficients is one way in which the present methods give rise to very high compression ratios that are not possible with conventional compression techniques based on random text pattern matching.

Fourth, the method described herein is specifically designed for compressing ordered series data that is sparse.

Fifth, unlike existing compression techniques that independently and separately attempt to compress the x and y values, the method of this invention takes advantage of the frequency of occurrence of both intensity and hop offset distances, and compresses the y data intensity levels together with the incremental x hop offset distance values.

Furthermore, the proposed method of this invention is designed for high throughput compression of data in near constant lookup time, regardless of the amount of data. The decompression time is even faster, since most computations are done during compression, and the decompression is reduced to simple sequence of hash map lookup and write to the output buffer.

As mentioned above, sparse data is particularly suited to compression using the methods and systems described here. As used herein the terms "sparse" and "sparse data" refer to a data set in which only a small portion of the total number of points in the data are associated with meaningful signal of the actual sample being analyzed, the majority of the data in the set is attributed to noise (e.g. electrical or chemical) which is always present, such as in the detector and analog-to-digital circuits, as well as due to contaminants and/or solvents that come with the material to be analyzed. In typical mass spectrometry data such as the example shown in FIG. 2, less than 5% of the data is comprised of ion fragments from the actual sample material being analyzed, and over 95% of the data is attributed to other sources unrelated to the material at hand. The aim of this invention is to leverage the "sparseness" of the data for achieving higher compression than otherwise possible with existing compression methods.

In particular, sparse ordered series data can comprise a plurality of observed (x, y) measurements, interspaced with intervals of quiet periods in between peaks, where the data remains relatively stable throughout the quiet periods, as illustrated in the example in FIG. 4. The quiet periods can correspond to regions in which the values are at or below a baseline threshold and/or are primarily dominated by noise.

Figure 6:
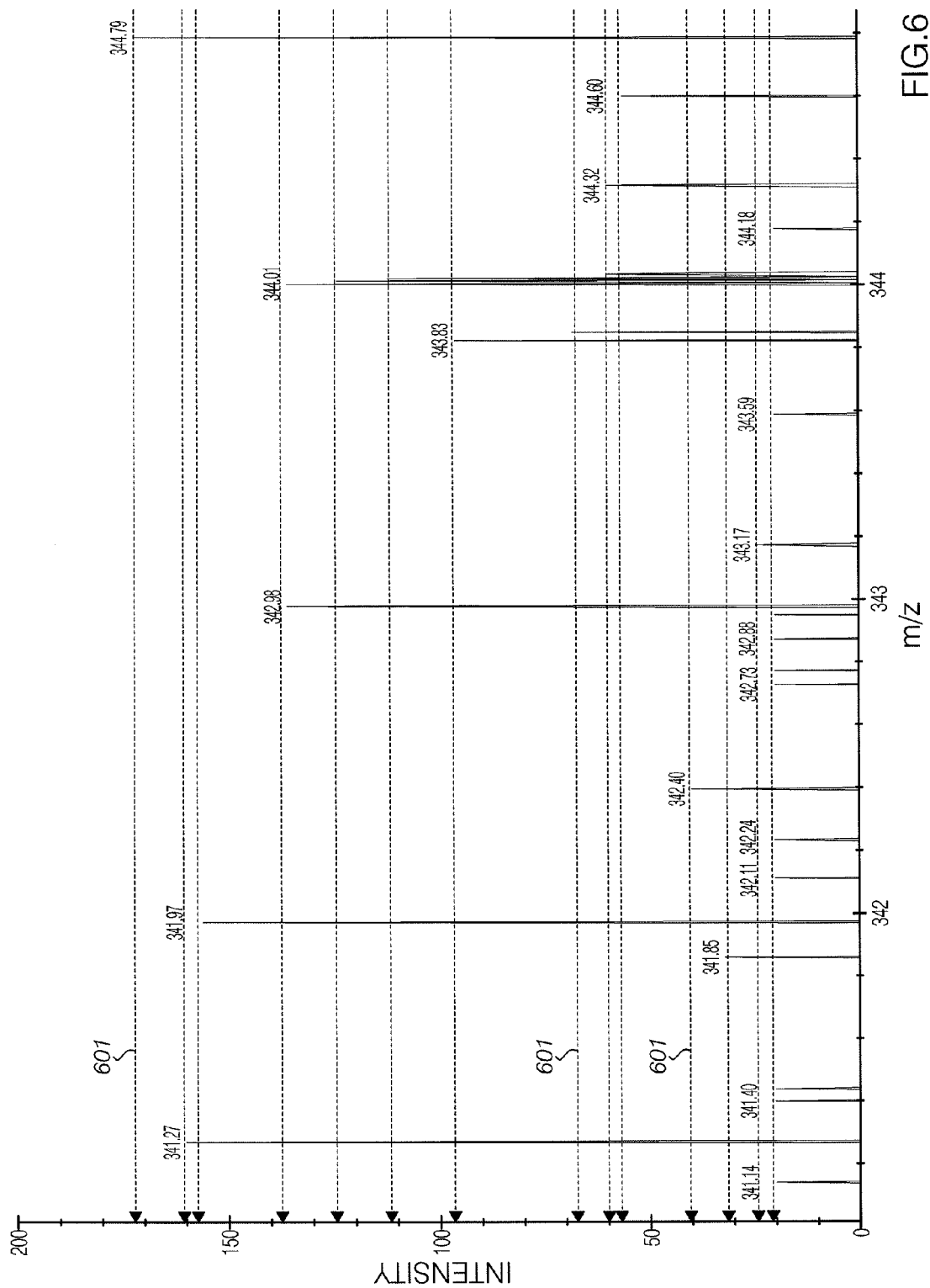
FIG. 6 illustrates an observed pattern of intensity values in a highly magnified region of the observed ordered series data of FIG. 2 (and previously illustrated in FIG. 4), in the range of 341 to 345 m/z. Note that only certain intensity values highlighted in dotted lines 601 are present out of the entire range of possible intensity values of 0 to 200.

A second aspect of data sparseness is illustrated in FIG. 6. The horizontal lines 601 illustrate the discrete nature of peak intensity levels in the data. In many practical situations the observed number of intensity levels is much smaller than the entire dynamic range of representation, namely, only a fraction of all possible intensity levels are actually observed in the data. The distribution of intensity levels is such that the smallest intensity peaks are the most numerous, where many of the smaller peaks share the same intensity levels, interspersed with far fewer large peaks in between. The method of this invention is designed to take advantage of the discrete nature of the intensity levels and leverage the particular intensity distribution of small similar peaks interspersed between few larger peaks to improve the compression. The method of this invention provides higher compression by eliminating unnecessary levels and generating code words only for levels that are actually observed in the data.

Figure 9:
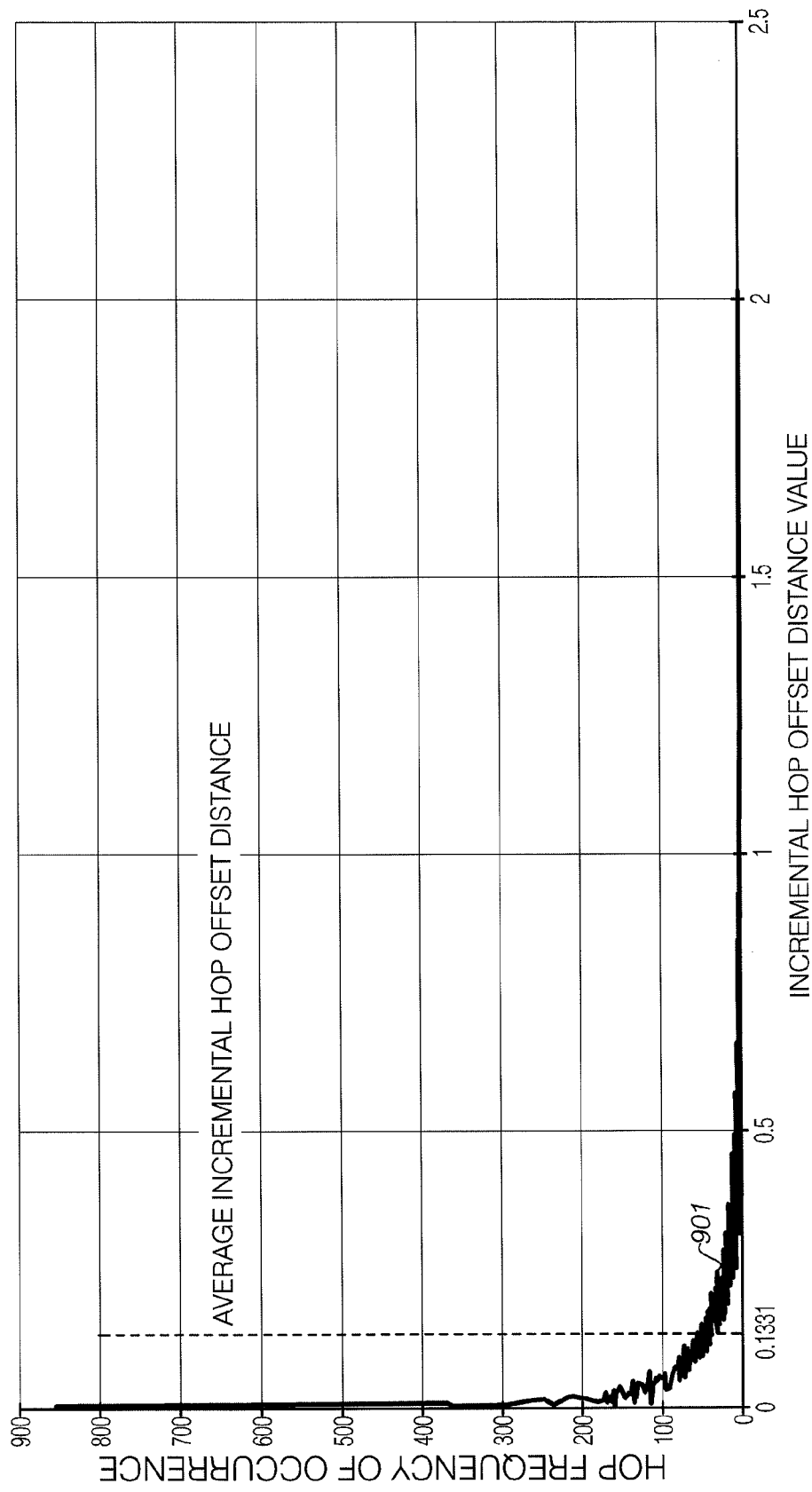
FIG. 9 provides an example histogram of hop frequency of occurrence versus incremental peak offset distance value. In this particular example, the hop frequency of occurrence is inversely proportional to the incremental offset distance value. The weighted average incremental offset distance is 0.1331 Daltons per hop. The shape of the curve 901 drops sharply as the incremental offset distance increases; the smallest incremental offset distance value occurs the most frequently, about 850 times in this example, while the number of occurrences drops rapidly as the incremental offset distance value increases, ending in a long tail of single occurrences for any incremental offset distance value larger than about 0.9 Dalton. The sharp drop in hop frequency of occurrence of the curve 901 can yield excellent compression.

Yet another aspect of data sparseness is illustrated in FIG. 9. Instead of attempting to compress the x data directly, the method of this invention transforms the observed x data values into a sequence of relative incremental hop offset distances, and compresses the resulting sequence instead. FIG. 9 illustrates the typical distribution of observed incremental hop offset distance values as a function of the hop frequency of occurrence. As witnessed by the steep curve 901, the number of occurrences drops sharply as the incremental hop offset distance increases, and the curve ends in a long tail of single occurrences. The combination of frequent small incremental hop offset distances with shareable hop distance values, combined with a small number of distinct incremental hop offset distance values (representative of the true "peptide" peaks), together with the ability to accurately predict the entire x data with just a few coefficients, is what give rise to order of magnitude better compression than otherwise possible with existing conventional compression techniques.

Figure 8:
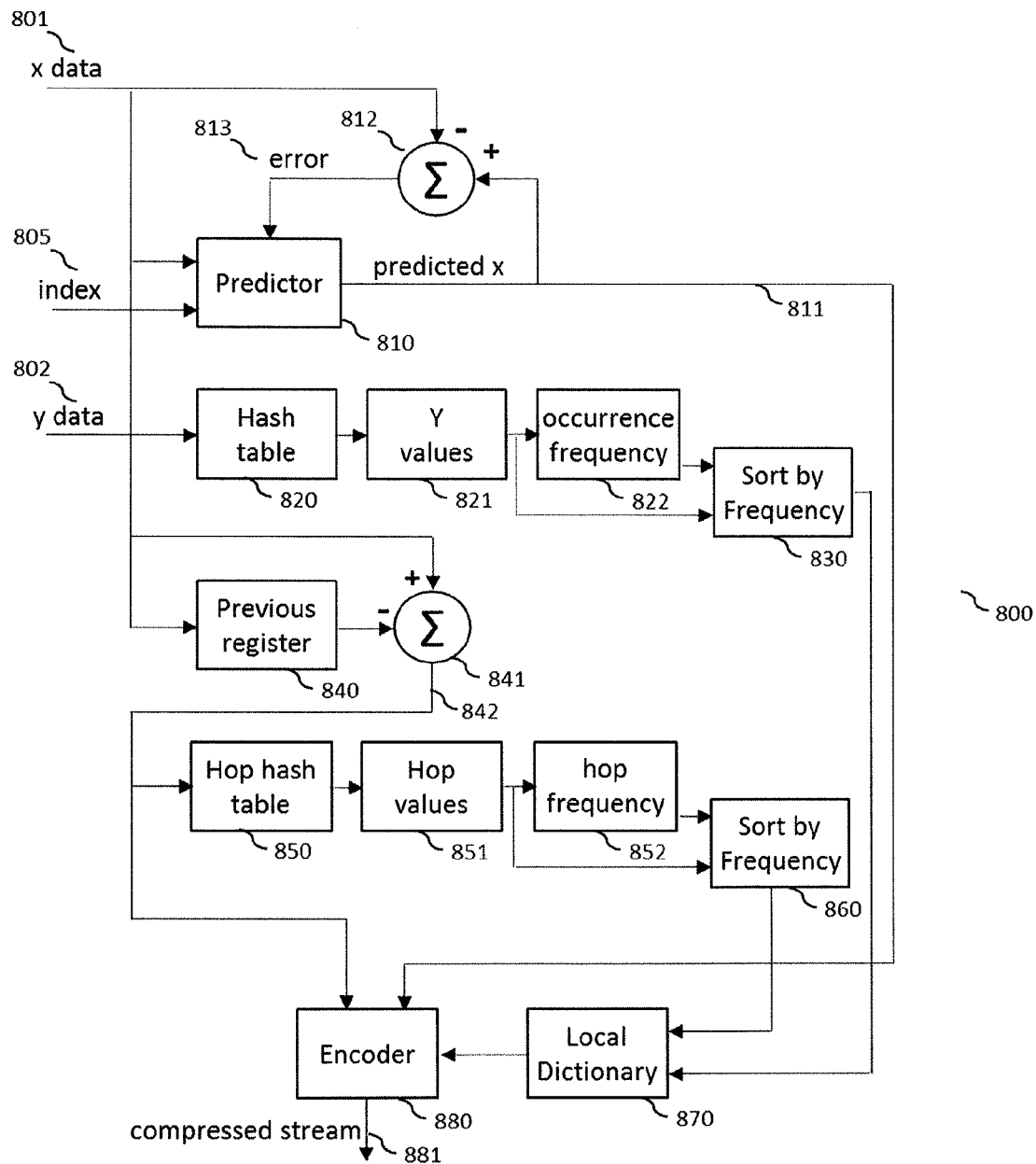
FIG. 8 provides a block diagram of the proposed ordered series encoder described herein.

FIG. 8 illustrates a block diagram of the proposed encoder 800 in accordance with this invention. The inputs to the encoder include the observed ordered-series data, comprised of the observed signal measurement values (y data, 802) at the observed measurement locations (x data, 801). In this embodiment, the x data 801 and y data 802 can be any ordered set of measurement pairs, indexed or over time, hence the combined x and y data represent a very common and highly generic ordered data series sequence.

Note that in many situations the first variable data, i.e. the x data, can be directly represented by the time itself. For example, when the observed second variable data, i.e. the y data, is measured over time, the y data becomes a simplified time-series sequence comprised of signal measurements over time. However, in the more general case, the y measurements are observed as a function of some other variable, which is also varying over time. The pairwise observations in the general case are made of pairs of observed (x, y) values over time, where the relation between the first variable, x, and time may not be known to the encoder. The index need not be explicitly recorded in the uncompressed data set. In some cases, the index (n) is merely a measure of the observation order, and therefore is an integer from 0 to N−1 (or 1 to N).

The problem of having to record large amounts of data from pairs of observed (x, y) measurements is a common problem in many areas. It occurs in many fields such as analytic chemistry, sensor data fusion and geo-location, seismic exploration, tracking, astronomy, and others. One example occurs in mass spectrometry, where inorganic or organic or biochemical molecules are ionized using such means as electrospray ionization or laser desorption or photoionization or electron-impact ionization, and an electromagnetic field is applied to the resulting ions to measure the composition of the sample at hand. The output of a mass spectrometer is comprised of a series of observed ion intensity or abundance levels (y data) as a function of m/z, the observed mass-to-charge ratio (x data). The mass spectrometry output is then comprised of a sequence of paired (x, y) observations. The mass spectrometer records a range of m/z values, and measures the intensity of the signal, reflecting the abundance of the ionized atom or molecule for each of the recorded m/z values. The amount of data produced by a single experiment can be huge, potentially up to dozens of gigabytes (1 GB=1.024×10$^9$ bytes) for a single data set. Mass spectrometry is heavily used by research and pharmaceutical companies for understanding disease phenomena and the discovery and development of drugs. Mass spectrometry is also heavily used for example in the chemical, petroleum and semiconductor industries to evaluate the composition of samples.

Regardless of the specific field, the output data is represented as an ordered sequence of paired (x, y) observations over time or another index, such as distance or mere a measure of observation order. The first variable (x) data 801 represent the value of the first variable, for example the selected m/z value at the time of observation. In other implementations, the first variable can represent time, wavelength or frequency. The second variable (y) data 802 represents the observed measurement, for example the observed ion fragment signal intensity for each instance of x. The relation of the first variable to the index may not be known to the encoder. In one instance, for example, the mass spectrometer can be programmed to detect all available m/z steps in increasing regular order, in which case, the sequence of m/z values comprising the x data will be proportional to time. However, in another instance, the machine can be programmed to detect the available m/z steps in decreasing regular order, resulting in an m/z sequence that is inversely proportional to time. In yet a third instance, the machine can be programmed to pick m/z steps in random order, or in accordance with some other internally beneficial rule. Therefore, the encoder cannot assume a particular relationship between the order of the sequence of (x, y) data and time. However, mass spectrometers are usually programmed to output all the observed data for the selected range of m/z values, so regardless of the specific order (proportional or inversely proportional, etc.), all the available (x, y) data will eventually be outputted in the specified order programmed into the machine.

In order to keep track of the (x, y) data order, the index, e.g. a time synchronization signal, 805 is also provided. This time signal can be as simple as the regular sample index in time. For example, the very first (x, y) observation is labeled to have been observed at time 0, and subsequent observations are indexed as time 1, time 2, time 3, and so on. The time sequence 805 index can be automatically generated internally by the encoder 800. The time index need not progress in regular steps or by integral values.

Predictor Function and Predictor Component

One objective of the compression is to reduce the amount of data necessary to represent the entire first variable (x) sequence, as well as the second variable (y) sequence. Thus one step in the present method is defining a predictor that calculates each first variable ($x_n$) as a function of the index.

A predictor 810 is used for predicting the first variable (x) sequence 811 out of the observed x data 801. Depending on the desired level of prediction accuracy and the shape of the relation of x to the index (n), the prediction may be based on all the available x data points, or on a combination of just a limited number of the most recent x data points. In one implementation of this invention, a global predictor may be used to predict the x data points 811 based on the available x data points 801. In another implementation, a local predictor may be used to predict the next x value in the sequence 811 based on a small limited number of N of the most recent observed x data points 801, where N is an arbitrary number. The type of predictor, local or global, is dependent on the complexity of the x values in relation to the index, and the desired prediction accuracy.

Figure 5:
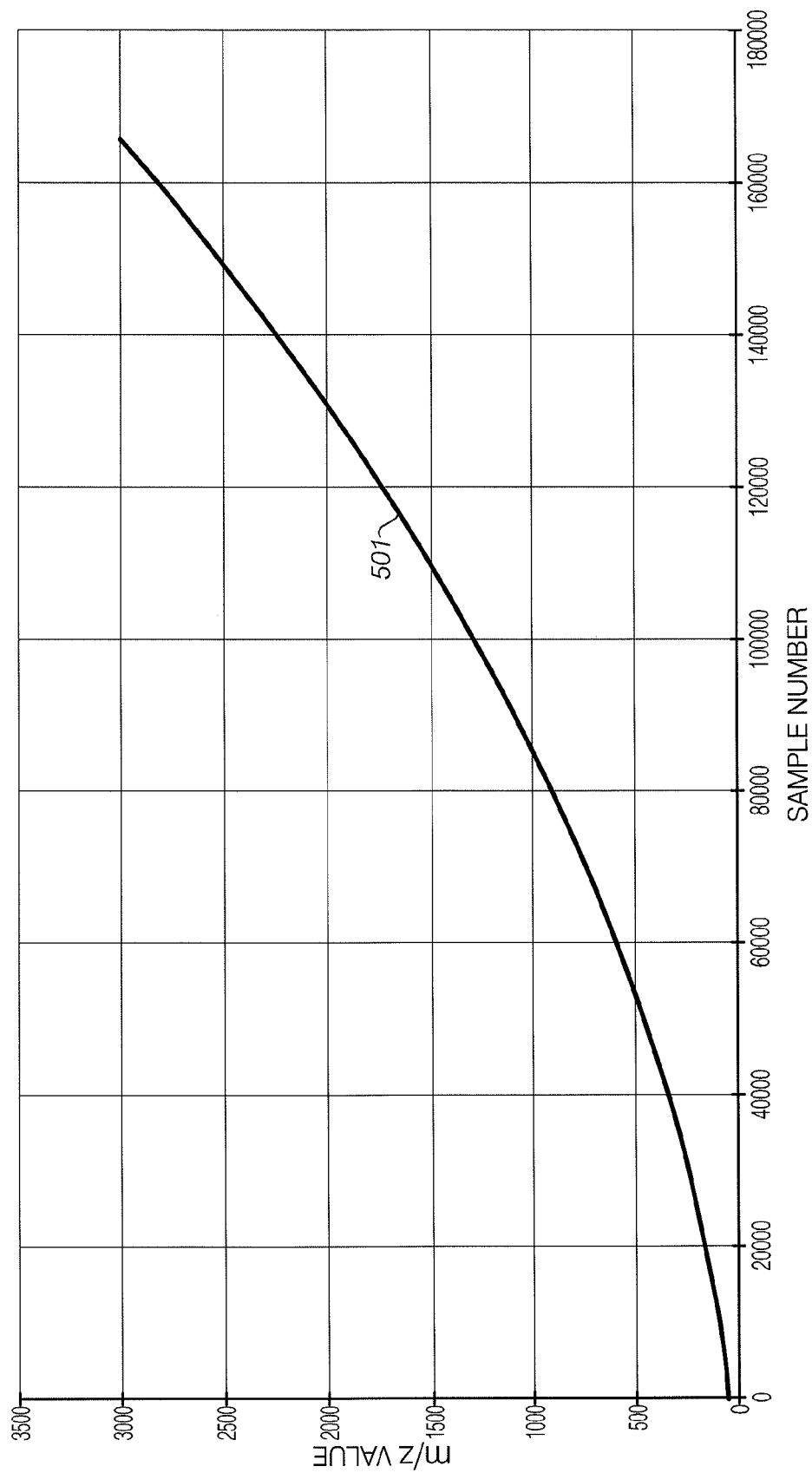
FIG. 5 illustrates a relationship between measured m/z values and corresponding data sample numbers (index). The horizontal axis of the plot in FIG. 5 shows the sequential sample index number, incrementing from 0 for the first observed measurement, to about 165,000 for the last observed measurement. For each x data point, a scatter point is drawn at the intersection of the observed time index and observed ink as an (x, y) point. A line connecting these 165,000 scatter points is shown as curve 501.

The ability to accurately predict the behavior of an observed set of data measurements is generally dependent on the data. In some cases the observed set of measurements of a given variable such as the first variable ($x_n$) exhibit a smooth and slowly varying characteristic behavior as a function of the index (n). For example, the curve shown in FIG. 5 illustrates the relationship between measured m/z values and corresponding data sample numbers is observed to be a smooth and slowly varying function. A predictor such as a low-order polynomial predictor would be suitable for predicting the observed first variable ($x_n$) behavior in this case with high accuracy.

In other cases the observed first variable ($x_n$) behavior may be different than a smooth and slowly varying behavior as a function of the index. For example, the observed first variable ($x_n$) behavior may appear to have a periodic component, or it may appear to have an erratic random component of vertical or horizontal movement, or a variety of other types of behavior not easily modeled by a low-order polynomial predictor. A different predictor other than a low order polynomial predictor would be needed in this case.

In one embodiment of this invention, a plurality of different predictors may be employed. The system analyzes the observed first variable ($x_n$) behavior in order to select the best predictor to use for each data sequence at hand, out of the available set of predefined predictors. Out of all the predictors available, the system dynamically selects one predictor that best models the observed first variable ($x_n$) behavior according to some criteria such as minimizing the prediction error overall. A reference to the selected predictor, indicating which predictor has been selected, is included with the compressed output.

In yet another embodiment of this invention, the observed first variable ($x_n$) behavior is analyzed in order to determine a suitable predictor model for the observed data at hand. The system may use machine learning methods to automatically attempt to learn the predictor model from the observed data. The resulting predictor model is then used for predicting the observed first variable ($x_n$) behavior.

In one implementation of this invention a global predictor is used for modeling the observed first variable ($x_n$) behavior when the observed first variable behavior function is relatively smooth. The advantage of using a global predictor is that the entire sequence of x data values, consuming many GB in total size, could be finely predicted with high accuracy by using just a small number of coefficients. In one example of a global predictor, a single model can be defined for predicting the first variable ($x_n$) as a function of the index (n) of at least a subset of a plurality of indexed x,y pairs, whereby the estimated or calculated predictor model variables are stored in a shared memory location or file, and shared across the plurality of indexed x,y pairs. A single mass spectrometry file is typically comprised of many thousand sets of such indexed x,y pairs, with each set of indexed x,y pairs containing up to $10^6$ ordered measurements, hence the use of a global dictionary across multiple sets can lead to significantly higher compression.

In another implementation of this invention, the entire range of x values is divided into a sequence of overlapping or non-overlapping intervals, and a piecewise predictor is used for predicting x data points 811 based on the available x data points 801 in each interval separately. The advantage of using a piecewise predictor is a potentially better prediction accuracy within each interval, and hence overall, especially when the behavior of the x data is not entirely smooth, such as when certain m/z intervals are scanned out of order. In one example of a piecewise predictor, the indexed set x,y pairs is further divided into a plurality of overlapping or non-overlapping interval regions, where the same or different predictor model is applied to each interval region separately, and the resulting estimated or calculated predictor model variables are applied separately to each interval region during decompression time In yet a third implementation of this invention, a local predictor is used to predict the next x output based on a given number of the preceding most recent x data observations. The advantage of using a local predictor is that it makes no assumptions about the global prediction and is thus capable of adaptively and dynamically adjusting the predictor model to the observed x data during the run. In one example of a local predictor, one or more different predictor models are defined for predicting each of the first variable ($x_n$) as a function of the index (n) independent of other of plurality of indexed x,y pairs, whereby the estimated or calculated predictor model variables are stored within the compressed data and used for locally predicting the particular indexed x,y pairs.

The use of local/global predictor is orthogonal to the type of predictor used (whole range or piecewise, etc.). For example, mass spectrometry data frequently contains many scans (i.e. spectra), each comprising an ordered set of (x,y) pairs. If the multiplicity of scan refer to the same x values, a global predictor would be appropriate. For example, Scan 1 includes x values 5, 7, 9, 13, 15, etc. and Scan 2 includes x values 5, 7, 11, 13, 15, etc. in which case Scan 1 is missing x=11 and Scan 2 is missing x=9. In this case, a single predictor can be used for all scans. And if all the scans are like that, occasionally missing or having an extra sample that follows the model, then there is no need to have a different predictor for each scan. Instead one global predictor is used for all the scans, with notations relating to the missing or extra data. This global predictor description is sent only once, unlike a local predictor where one predictor description is sent for each scan.

FIG. 5 illustrates one common example of a smooth and slowly varying observed x data relation as a function of the sample index, generated with a typical Time of Flight (TOF) mass spectrometry detector. The vertical axis of the plot in FIG. 5 represents the observed x data (801 in FIG. 8) as a function of the ordered sample index (n), spanning the range of about 49.0 to 3000.0 m/z in this example. The horizontal axis of the plot in FIG. 5 shows the ordered index number (805 in FIG. 8), incrementing from 0 for the first observed measurement, to about 165,000 for the last observed measurement. For each x data point, a scatter point is drawn at the intersection of the observed index and observed m/z as an (x, y) point. The line connecting these 165,000 scatter points is shown as the curve 501 in FIG. 5.

As can be seen from FIG. 5, the curve 501 is smooth and slowly varying as a function of the ordered index. A low-order polynomial fit could easily approximate the curve. Note, however, that although the mass spectrometer appears to be going through the ordered sample index range in sequential increasing order (from low to high m/z values), the relationship of the m/z value to the ordered index is generally non-linear. This is a common property of Time of Flight mass spectrometers. The curve 501 appears to be convex, with the slope gradually increasing towards higher m/z values.

A polynomial predictor would be an ideal candidate for the curve 501, if one could find an accurate function x=g(n) that could accurately describe the curve 501 for each index. Based on the shape of the curve 501, a linear projection function of m/z to ordered index would not provide adequate accuracy, since the curve is convexly bowed, and a higher order fit would be needed. In one implementation of this invention, the local or global predictor is an nth order polynomial function, preferably based on the fitting of a higher order polynomial of a degree >2 to the data. Higher polynomial order will result in better fitting accuracy overall. In one implementation, the fit polynomial order is successively increased until the desired accuracy is met, in terms of either the maximum per point error (for any point in the index range), or the average mean-square error overall (for all the points in the mass range). The purpose is to place an upper bound on the fitting accuracy in order to guarantee the accuracy of the x data values to within a desired tolerance.

The mass accuracy is critical for sequence identification from mass spectrometry data. As a common practice in the field, the mass accuracy should be better than 1E-6, or ±0.000,001 Dalton on a mass of up to 5000 Daltons. The method according to this invention provides an accuracy of better than 1E-8 or ±0.000,000,01 Dalton for lossy compression, and zero error for lossless compression. Therefore, in mass spectrometry implementations, preferably the maximum per point error is less than IE-6 Dalton, more preferably, less than IE-8 Dalton. In a most preferred implementation, the error is zero, with no predicted m/z value being different than the recorded value.

Once a local or global predictor of adequate quality is found, the entire sequence of observed x data points can be entirely eliminated, and be replaced by the prediction function coefficients. For instance, the curve 501 can be approximated by a third-order polynomial:

$$g(n)=a_0+a_1*n+a_2*n^2+a_3*n^3$$

with an accuracy of better than 12 significant digits at the maximum point-wise error. Once the values of the coefficients ($a_0$, $a_1$, $a_2$, $a_3$) have been determined in the approximation, the entire sequence of x data points can be eliminated. Instead, a description of the predictor, in this case, only the four polynomial approximation coefficients, are written to decoder legend of the compressed output. At decompression time, the entire sequence (comprised of about 165,000 m/z values) can be instantly generated using the four polynomial approximation coefficients, by repeatedly substituting the index n into the g(n) equation above. And the accuracy of the approximation in this case is guaranteed to 12 significant digits, namely an error of ±0.00000003 on the largest m/z value of about 3,000.0 Dalton.

In many situations the observing instrument is programmed to make repeating scans of the m/z values over time, where in each scan there exists a strictly monotone 1:1 relationship between the sample number and corresponding m/z value mapping. This relationship often is preserved for multiple subsequent time-series scans by the observing instrument. Thus, in certain implementations, a description of a global predictor function may be computed from one or more scans, and stored only once for all subsequent scans in a global location within the compressed output. During decompression time, the global predictor is used to restore the observed x data only once, and the restored x data is shared and copied to all subsequent scans that use the same global predictor. Eliminating the need to store any additional predictor descriptions for the subsequent scans, for potentially thousands of scans, can lead to higher compression.

If multiple predictors are applied, the description of the predictor comprises a description of each predictor. The multiple predictors can be enumerated as predictor 1, predictor 2, and so on, where the currently used predictor type is referenced by a number. The description of the predictor can comprise a computed or learned set of predictor model variables and/or constants.

The ability to accurately replace hundreds of thousands of subsequent (non-linear) double precision floating point m/z values (8 bytes each) with just four double precision floating point coefficients is one way in which the present methods give rise to extremely high compression ratios, much higher than otherwise possible with conventional compression methods, such as GZIP, deflate and LZW, which are based on random text string pattern matching.

It should be pointed out that the proposed polynomial fitting is just but one of the possible methods for eliminating the x data sequence, provided here as an exemplary embodiment for completeness of the description. In other implementations, different approximating functions may be used with a global or local predictor, depending on the shape of the curve 501 and the desired smoothness and accuracy of the fit. For example, spline or wavelet functions, or any number of other suitable approximation function can be used with the predictor.

Returning to FIG. 8, in some implementations there is a desire to preserve the original x data as is, without making any approximation that could potentially alter the value of even a single m/z value. The common term used in the industry is lossless compression—that is, obtaining exactly the same x values after decompression as obtained at the input 801. Thus, the predictor optionally further comprises an error correction mechanism. In some implementations, the error correction mechanism computes the prediction error between each actual and predicted first variable ($x_n$) as a function of the index (n), and feeds the error back to a subsequent first variable ($x_n$) prediction, such that the error serves to correct the next prediction cycle, instead of getting thrown away and lost, thereby improving the overall accuracy. To ensure lossless compression, a low-bandwidth stream of small local corrections may be added to the compressed output.

In one implementation of this invention a lossless compression scheme is obtained by adding the error mechanism 812 and 813 in FIG. 8. The lossless compression scheme is based on the realization that one is permitted to make the approximation and alter the x data values in order to obtain high compression, provided that the approximation errors can later be precisely removed at decompression time, in order to restore the exact original values. In one implementation of this invention, an error difference component 812 is added to compute the prediction error by taking the difference between the predicted x value 811 and the original incoming x value 801, for each data point in the sequence. The error signal 813 is then fed back into the predictor in order to compensate the next subsequent prediction based on the error signal. In one implementation, the error signal is subtracted from the next subsequent x input value 801, prior to applying the predictor 810. Since the function g(n) is relatively smooth as shown in curve 501 FIG. 5, the prediction error is bound to be practically the same for two subsequent x data points anywhere in the sequence. Hence by calculating the prediction error of a given point in time and subtracting it from the next incoming value will tend to cancel the prediction error out. In yet another implementation, the second prediction error difference, after subtracting the prediction error of the previous x point, is outputted to the compressed output stream as a small side channel low-bandwidth information that is used to correct the restored x values at decompression time. Since the second prediction error is very small, and in many cases often zero, the amount of extra bandwidth needed to communicate the minute secondary error corrections tends to be quite small.

In one implementation of this invention, the error feedback mechanism is implemented directly in the binary data domain (as 8 byte data), without having to first interpret the data and convert it to a sign-mantissa-exponent for operating on it as a double precision floating point number.

Amplitude Coder Component

Continuing with FIG. 8, and turning attention to the observed second variable (y) data measurements 802. The y data represents the observed measurements values at the given x data points. For example, the y data may include the sequence of observed intensity abundance, or amplitude, of peaks at the given m/z x-data values.

In certain implementations, the step of assigning an amplitude code word to each $y_n$ based on the value and frequency of the $y_n$ comprises: (i) generating a hash table for amplitude values; and (ii) looking up each of the second variable ($y_n$) values in turn; (iii) sorting the list of amplitude values by their associated frequency occurrence; and (iv) assigning a unique amplitude code word to each unique amplitude value in the list of amplitude values, wherein the shortest code words are assigned to the most frequently occurring amplitude values. When looking up each of the second variable values, if the $y_n$ value is not previously seen, then the $y_n$ value is added to a list of amplitude values and an associated frequency occurrence is set to one. And if the $y_n$ is already present on the list of amplitude values, then the associated frequency occurrence is incremented by one. In a preferred implementation, any $y_n$ value less than or equal to a baseline threshold is skipped.

A typical mass spectrometer output is shown in FIG. 2. The horizontal axis represents the mass over charge m/z, which ranges from about 190 to about 2900 Dalton. Note that the regions 201 and 202 below 190 Dalton and above 2900 Dalton contain zero data, and may not be outputted. The vertical axis represents the intensity abundance y-data values, spanning the range of 0.0 to about 68,000.0 detector counts. Of course the y-data range must be large enough to accommodate the entire range from smallest (generally zero count) to largest intensity value.

FIG. 3 shows a magnified view of FIG. 2, centered on the range of approximately 300 to 390 m/z. As can be seen, the data is comprised of a sequence of peaks with varying intensity levels at various m/z values. As can be understood from FIG. 3, the data is comprised of a sequence of peaks 301 with varying intensity abundance.

FIG. 4 presents a further magnified region of FIG. 3, centered on the range of approximately 341 to 345 m/z. As can now be seen, the data is comprised of a sequence of peaks 401 with varying intensity abundance, separated by intervals of zero data 402. The data is said to be sparse when the intensity values in the regions 402 between peaks are set to a fixed constant value, which may be zero. In the general sense, the second variable $y_n$ data is comprised of a sequence of variable amplitude measurements interspaced with intervals of relatively quiet periods during which the $y_n$, data remains moderately constant and primarily dominated by noise. In a typical mass spectrometry data set such as the example shown in FIG. 2, less than 5% of the data is comprised of ion fragments from the actual sample material being analyzed, and over 95% of the data is attributed to other sources unrelated to the material at hand. The peaks corresponding to noise and other data unrelated to the material being analyzed generally have lower intensity values. Due to the above conditions, there are on average many low intensity noise peaks between each pair of the material ion fragments peaks, where each interval between material ion fragments peaks is comprised of many such noise-dominated peaks. Since the noise-dominated peaks tend to have the lowest intensities overall, the intervals between material ion fragments peaks appear to be relatively quiet, on average. The actual intensity levels of what constitutes a relatively quiet noise-dominated interval between material ion fragments peaks may be determined from the observed Y data behavior.

A second aspect of data sparseness is illustrated in FIG. 6. In many situations the observed number of intensity levels in any given data is far smaller than the implied possible number of levels based on the y data range. The y data intensity range is commonly represented as a double precision floating point number as well. However, since the accuracy of measuring the intensity abundance is far less critical to sequence identification than the m/z accuracy, some instrument vendors reduce the precision of the intensity abundance to single precision floating point number (4 bytes instead of 8 per sample). Even then, the range of intensity abundance of 0.0 to 68,000.0 gives rise to many millions of possible intensity abundance values.

However, on close inspection of FIG. 6, one may notice that many of the smaller peaks share the same intensity abundance levels, and larger peaks are far and few in between. The data shown in FIG. 6 is the same as in FIG. 4, with the addition of the horizontal lines 601 indicating all the peak intensity levels present in this highly magnified region. Every peak present in FIG. 6 is touching one of the 601 lines. The smallest intensity peaks are the most numerous, all touching the first lower most 601 line at intensity value of about 20. The next higher intensity peaks touch the second lowest 601 line, and so on. Finally, the largest peak in FIG. 6 touches the uppermost line 601, and there is only one such peak at this intensity level, while in contrast there is a total of 13 peaks that touch the lowermost 601 line. Overall, the number of discrete intensity abundance levels is far smaller than the y-data range makes possible. For instance, there is a total of only 14 distinct amplitudes in FIG. 6—the total number of 601 lines. The data is also said to be sparse when the number of distinct observed intensity abundance levels is relatively small as compared with the total number of possible levels implied by the y-data range. Moreover, in many cases the total number of non-zero peaks is usually an order of magnitude smaller than the number of observed x data points.

The discrete nature of the intensity signal gives rise to additional compression by eliminating all the unnecessary input levels and generating code words at the compressed output stream only for the levels that are actually observed in any given data set. However, since the observed intensity abundance levels are not known in advance, they have to be extracted from the observed y data sequence.

Additionally, the discrete nature of the intensity signal gives rise to additional compression by hashing the discrete intensity values and generating a sequence of code words that minimizes the resulting code length based on the frequency of occurrence and arithmetic entropy encoding, where the most common intensity (smallest peak value in this example) is assigned the shortest code word and vice versa. In addition, companding may be applied when the frequency of occurrence is inversely proportional to the peak intensity, where small peaks are proportionally more abundant than large intensity peaks.

The amplitude encoder (amplitude encoder component) that handles the incoming second variable (y) data 801 starts at the middle section of FIG. 8. The sequence of observed y data values is fed into the hash table component 820. For performance reasons, rather than manually comparing an entry to all previous entries, the hash table component is guaranteed to look up previous entries in the hash table in constant look up time. Each observed y data input 802 of the sequence is looked up in turn. If the current intensity abundance level is new, not previously seen, the observed y intensity level is added to the list of y values 821, and a count of 1 is added to the list of frequency occurrence table 822, since this is the first time this new entry is seen. The hash table component 820 is updated concurrently with the list of y values 821, and the list of frequency occurrence table 822. If, on the other hand, a particular intensity level has already been seen before, the hash table component 820 looks up the entry to retrieve its table index in constant time. The retrieved table index is then used for accessing the corresponding entry in the list of frequency occurrence table 822 and increment its value by one. This process repeats for all the observed intensity values. When the process ends after the last entry, the size of the hash table component 820 contains the number of distinct intensity abundance values in the y data. Additionally, the y values component 821 contains the list of distinct intensity abundance y data values, and the frequency occurrence table 822 contains the number of entries observed of each distinct intensity abundance value.

In the next step, the list of distinct intensity abundance y values 821 is sorted by the frequency occurrence table 822, as shown in the sort by frequency component 830. The reason for sorting is for helping an entropy arithmetic encoder to allocate the shortest code words to the most frequent intensity abundance levels. However, for reasons that will become apparent below, the probability distributions of the intensity abundance levels are not usually well represented by log powers of two, hence the use of conventional Huffman encoding will tend to produce inferior results. Instead, the use of clustered encoding could provide near optimum results.

In some cases, assigning an amplitude code word to each $y_n$ includes assigning one code word to represent a plurality of y values. In certain cases, patterns within the data will become apparent. For example, a signal intensity value of 20 ($y_n=20$) might always be followed by a signal intensity value of 31 ($y_n+1=31$). In which case, a single code word can be assigned for the pair of y values, y=20 followed by y=31. If such a pair of y values appears frequently within the data set, significant additional data compression can be achieved by combining multiple y sequences into such shared code words.

A similar compression advantage can be used for repeats and skips, because these are regular code words like any other code word. For example, a long repeat or skip sequence typically can be broken into parts, since it is not efficient to have many different code words for each different repeat or skip value. Thus a long sequence is implements as a series of a combination of say repeat 4096, repeat 256, and repeat 64, and all combinations of any repeats 16 or less. This method allow for frequent small repeats to be effectively handled with single code words, while longer repeats are broken into a sequence of smaller repeats and thus may take 3-6 code words to implement. The decision where to place the repeat cutoffs is data dependent in order to optimize the overall compression.

Figure 7A:
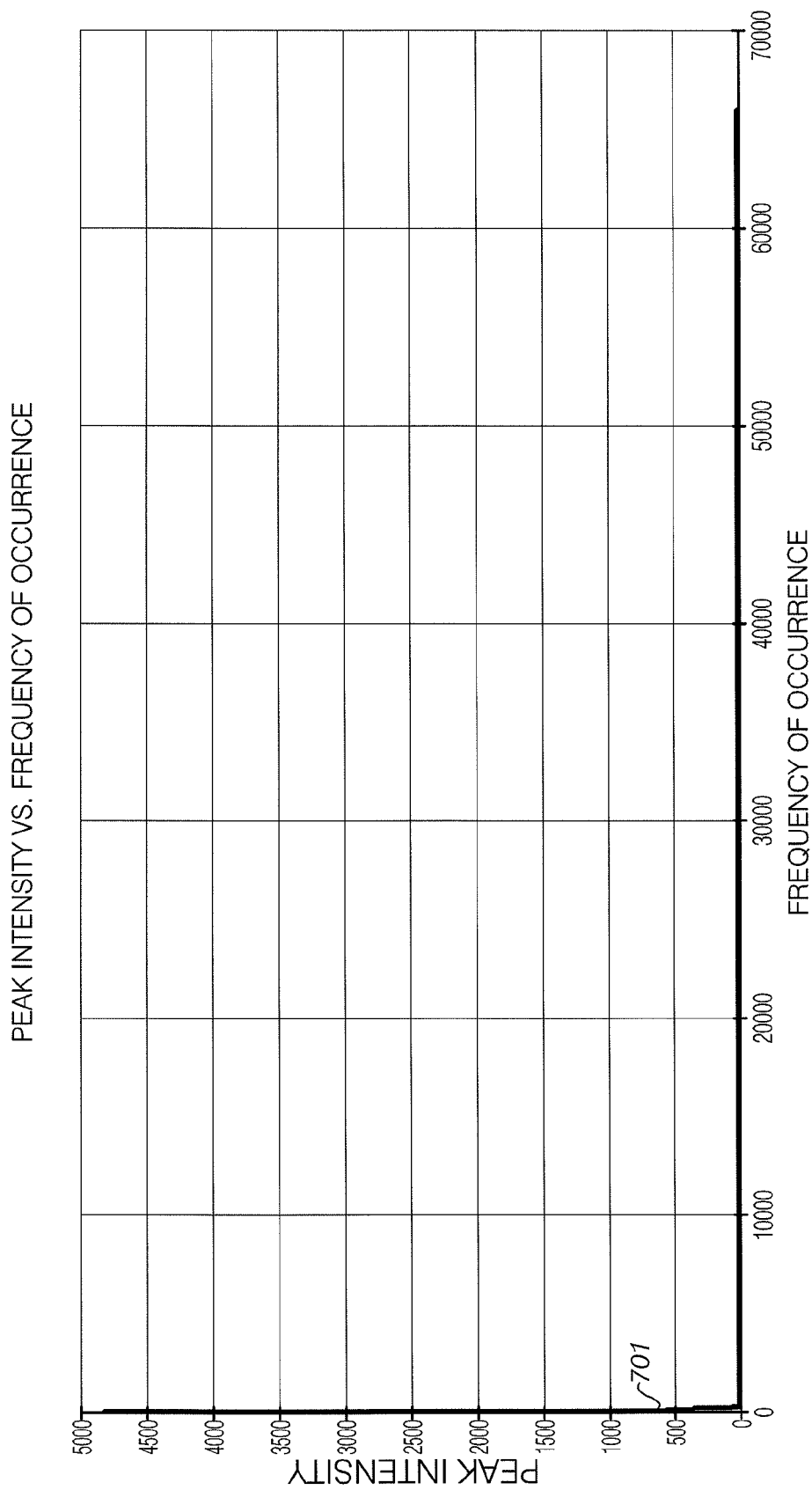
FIG. 7A provides an example of a distribution of peak intensity values versus the frequency of occurrence.

In some implementations, the second variable ($y_n$) data is comprised of a non-uniform multi-modal distribution of amplitude ranges, where certain amplitude ranges that occur frequently are interspaced with other amplitude ranges that occur much less frequently. FIG. 7A illustrates the typical distribution of observed peak intensity abundance values as a function of the frequency of occurrence. As previously noted, peaks with the lowest intensity abundance values typically are the most frequently encountered. In the example shown in FIG. 7A, the lowest intensity value appears about 4800 times. However, as can be seen by the steep curve 701, the number of occurrences sharply drops as the intensity abundance level increases. The number of occurrences is quickly reduced by orders of magnitude within the first few intensity abundance levels.

Figure 7B:
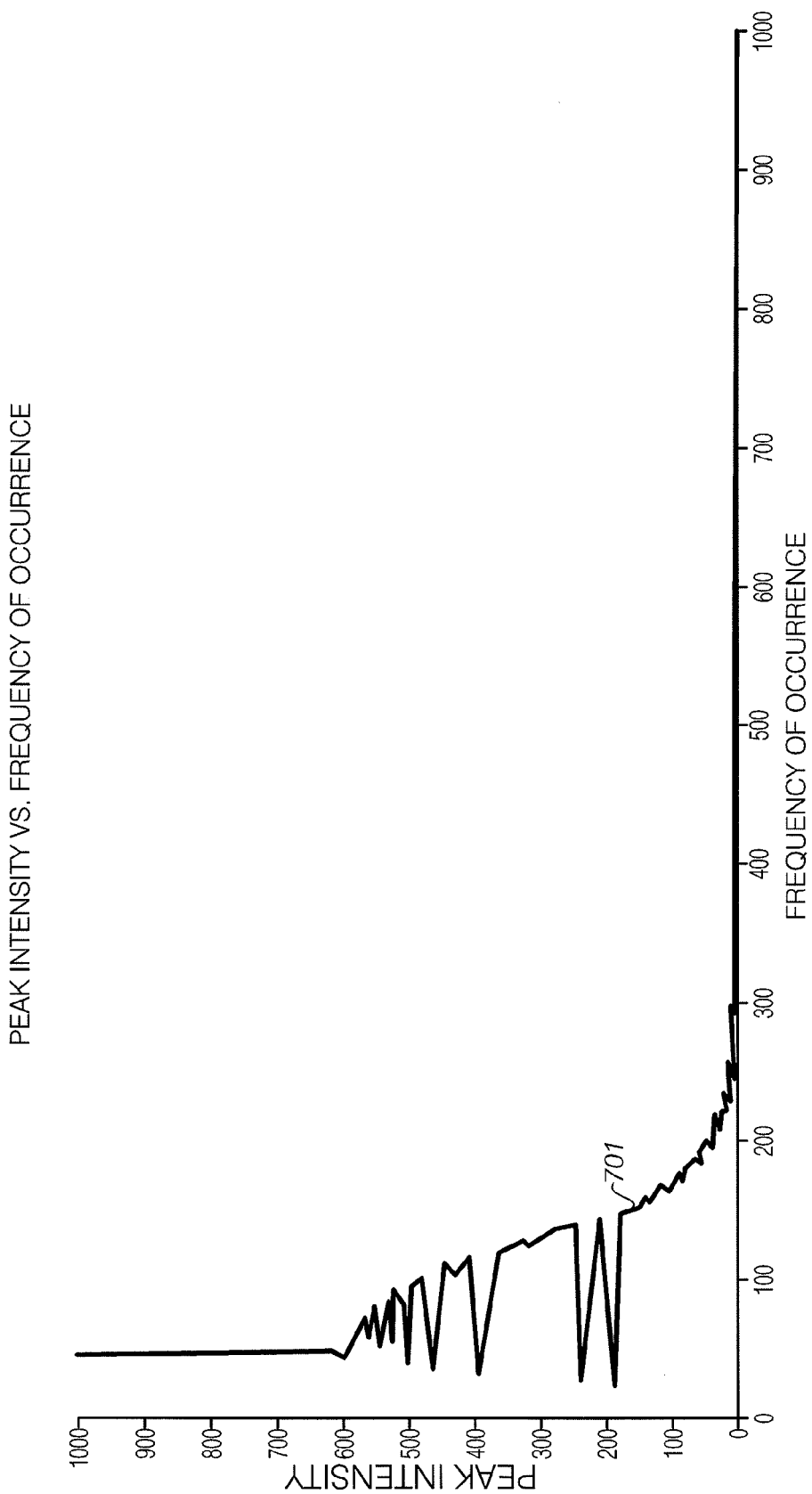
FIG. 7B provides a highly magnified view of the 'knuckle' where the data transitions from high frequency-low intensity value to low frequency-high intensity values (i.e. the true "peptide peaks").

In many situations the measured intensity values are sparse in that only a small subset of intensity values are observed out of the entire range of possible intensity values (between 0 and 5000 in this case). In this particular example, there are only 227 distinct intensity values. As can be seen by the curve 701, the frequency of occurrence is sharply inversely proportional to the peak intensity value; the smallest intensity occurs the most frequently, about 4800 times in this example, while the number of occurrences drops rapidly as the intensity value increases, ending in a long tail of single occurrences for any intensity value larger than about 3,300 (see FIG. 7B). The relatively low number of discrete intensity values, compounded by the sharp drop in frequency of occurrence of the curve 701, can potentially provide excellent compression.

The relatively low number of discrete intensity values, compounded by the sharp drop in the frequency occurrence curve 701 ending in the long tail of single occurrences, can typically provide excellent compression with the appropriate encoding. Especially when there is a powerful combination of a small number of distinct intensity values, a few frequent low intensity peaks with shareable intensity levels, and a small number of large peaks of distinct intensity levels (the true "peptide" peaks). This combination, together with the ability to accurately predict the entire x data with just a few coefficients, is what give rise to order of magnitude better compression than otherwise possible with existing conventional compression techniques.

Hop Coder

Returning to FIG. 8, the next part of the encoder, the hop code component (hop coder), deals with the locations of peaks. As stated earlier, the number of non-zero peaks is generally far smaller than the number of observed x data points. To take advantage of this, in one implementation, the encoder never sends code words for zero intensity peaks or for very low-intensity peaks whose intensity is below a pre-defined threshold. Instead, all peaks are automatically initialized to zero intensity at the beginning of decompression time by initializing the data buffer with zeros. Only the peaks with non-zero intensity abundance levels must then be written into the buffer. As used herein, the term non-zero refers to intensity levels above a pre-defined threshold, whether that pre-defined threshold is zero or another value. Hence the number of data points to be written into the buffer is much smaller than the buffer length. In a typical mass spectrometry data set, the number of non-zero peaks is typically less than about 10% of the number of x data points.

Additionally, the encoder leverages the incremental writing of peaks to identify the location of the next peak to be written. Instead of using direct addressing into the buffer with absolute buffer addresses, which would require long addressing, the encoder uses the last written peak location as a reference, and computes the local incremental offset to the next peak to be written. The offset from one non-zero peak to the next is always positive, and because of the high frequency of occurrence of the smaller noise-dominated peaks, the offset can be kept in a small number of bits, thereby eliminating the need for long buffer addressing.

In many data sets, the first variable $x_n$ data has a non-uniform multi-modal distribution of hop $\Delta n$ ranges, where certain hop ranges that occur more frequently are interspaced with other hop ranges that occur much less frequently. In some cases, the first variable $x_n$ data is comprised of a sequence of variable magnitude hop ($\Delta n$) values, corresponding to higher amplitude ($y_n$) measurements, that are interspaced with intervals of smaller $\Delta n$ magnitude values, wherein these small magnitude values correspond to lower amplitude $y_n$ data which remain moderately low and primarily dominated by noise.

In one implementation, the step of calculating a hop offset value ($\Delta n$) for each $y_n$ comprises: (i) identifying an initial hop offset value ($\Delta 0$) and entering the $\Delta 0$ into a previous register as a previous peak location; (ii) feeding each index (n) into the previous register subtracting the previous peak location from the index (n) to calculate the hop offset value ($\Delta n$) and then replacing the previous peak location with the index (n); and (iii) repeating step (ii) for each index (n) in the sparse multidimensional ordered series data. In an alternate implementation, the step of calculating a hop offset value ($\Delta n$) for each $y_n$ comprises: (i) identifying an initial hop offset value ($\Delta 0$) and entering the $\Delta 0$ into a previous register as a previous peak location; (ii) feeding each first variable ($x_n$) value, in turn, into the previous register subtracting the previous peak location from the $x_n$ value to calculate the hop offset value ($\Delta n$) and then replacing the previous peak location with the current $x_n$ value; and (iii) repeating step (ii) for each $x_n$ in the sparse multidimensional ordered series data.

The observed x data 801 is fed into a previous register 840 that holds the previous peak location. Only the location of non-zero intensity abundance peaks is written into the previous register 840, all zero intensity x values are skipped. The distance 842 to the next peak to be written is computed by taking the difference 841 between the current non-zero intensity peak x-location and the previous non-zero intensity peak x-location stored at the register 840. The effect of skipping all the zero intensity peaks can be thought of as concatenating all the non-zero intensity peaks together and transmitting only this information together with the subsequent hop offsets, without ever having to encode the zero-intensity intervals. For each non-zero peak in turn, the peak intensity as well as the distance from the previous peak are hashed and compressed together into the compressed output stream. Hop values can also be calculated in the same manner based upon the index n, rather than x data, using the same process replacing all x values with their corresponding indices (n).

After the hop offset distance is computed, a code word is assigned to each observed hop offset ($\Delta n$) based on the value and frequency of occurrence. In one implementation, the step of assigning a hop code word to each $\Delta n$ based on the value and frequency of the $\Delta n$ comprises: (i) generating a hash table for hop offset values; (ii) looking up each hop offset value ($\Delta n$) value in turn; (iii) sorting the list of hop values by their associated frequency occurrence; and (iv) assigning a unique hop code word to each unique hop value in the list of hop values, wherein the shortest code words are assigned to the most frequently occurring hop values. When looking up each hop offset value, if the $\Delta n$ value is not previously seen, then the $\Delta n$ value is added to a list of hop values and an associated frequency occurrence is set to one, and if the $\Delta n$ is already present on the list of hop values, then the associated frequency occurrence is incremented by one.

After the hop offset distance has been computed, the processing in subsequent components 850, 851, 852 and 860 is similar to the y data intensity processing components 820, 821, 822 and 830. The sequence of observed incremental peak-to-peak offset distance values is fed into the hop hash table component 850. As before, the hop hash table component is guaranteed to look up previous entries in the hash table in constant look up time.

Each observed incremental offset distance value 842 of the sequence is looked up in turn. If the current incremental offset distance is not previously seen, the observed incremental offset distance is added to the list of hop values 851, and a count of 1 is added to the hop frequency occurrence table 852, being the first time this distance entry is seen. The hash table component 850 is updated concurrently with the list of hop values 851 and the hop frequency occurrence table 852. If, on the other hand, a particular incremental offset distance value has already been seen before, the hop hash table component 850 looks up the entry and retrieves its table index in constant time. The retrieved table index is then used for accessing the corresponding entry in the hop frequency occurrence table 852, and incrementing its value by one. This process repeats for all the observed incremental offset distance values in the sequence. When the process ends after the last entry, the size of the hash table component 850 contains the number of distinct incremental offset distance values in the x data. Additionally, the hop values component 851 contains the list of distinct incremental offset distance values, and the hop frequency occurrence table 852 contains the number of entries observed of each distinct incremental offset distance value.

In the following step, the list of distinct hop values 851 is sorted by the hop frequency occurrence table 852, as shown in the sort by frequency component 860. The reason for sorting is for helping the entropy arithmetic encoder to allocate the shortest possible code words to the most frequent intensity abundance levels, in order to minimize the resulting compressed code length overall. As indicated above, the probability distribution of the incremental offset distance values are not usually well represented by log powers of two, hence the use of conventional Huffman encoding will tend to produce inferior results. Instead, the hop values are combined with the intensity abundance levels, and compressed together by using clustered encoding for providing near optimum results.

FIG. 9 illustrates the typical distribution of observed incremental hop offset distance values as a function of the hop frequency of occurrence. As noted earlier, hop distances with the lowest incremental offset distance values are the most frequently encountered. In the example shown in FIG. 9, the lowest incremental offset distance value appears about 850 times. However, as can be seen by the steep curve 901, the number of occurrences drops sharply as the incremental hop offset distance increases. The number of occurrences is dramatically reduced by orders of magnitude within the first few incremental hop offset distance values. In addition, the curve 901 ends in a long tail of single occurrences for any incremental offset distance value larger than about 0.9 Dalton.

The sharp drop in the hop frequency occurrence curve 901 ending in the long tail of single occurrences can typically provide excellent compression with the appropriate encoding scheme. Especially when there is a powerful combination of a few frequent low incremental hop offset distance peaks with shareable hop distance values, together with a small number of large peaks of distinct incremental hop offset distance values (representative of the true "peptide" peaks). This combination, together with the ability to accurately predict the entire x data with just a few coefficients, is what gives rise to order of magnitude better compression than otherwise possible with existing conventional compression techniques.

In some cases, assigning an amplitude code word to each hop offset value ($\Delta n$) includes assigning one code word to represent a plurality of hop values. In certain cases, patterns within the data will become apparent. For example, a peak having signal intensity value of 20 might always be followed by a peak having signal intensity value of 31 with an m/z value of exactly 0.23 m/z, followed by a peak 0.31 m/z later having signal intensity of 32. In which case, a single code word can be assigned for the pair of hop values, Δn=0.23 followed by Δn+1=0.31. If such a series of hop distances values appears frequently within the data set, significant additional data compression can be achieved by combining multiple hop offset sequences into such shared code words.

A similar compression advantage can be used for repeats and skips, because these are regular code words like any other code word. For example, a long repeat or skip hop sequence typically can be broken into parts, since it is not efficient to have many different code words for each different repeat or skip value. Thus a long sequence is implements as a series of a combination of say repeat 4096, repeat 256, and repeat 64, and all combinations of any repeats 16 or less. This method allows for frequent small hop repeats to be effectively handled with single code words, while longer hop repeats are broken into a sequence of smaller repeats and thus may take 3-6 code words to implement. The decision where to place the repeat cutoffs is data dependent in order to optimize the overall compression.

Dictionary Component

Continuing with FIG. 8, the remainder of the encoder block diagram includes the local dictionary (dictionary component 870) and the encoder component 880. The local dictionary component 870 is responsible for preparing the additional information necessary for decompression. In particular, the local dictionary component 870 is responsible for the preparation of a pair of inverse lookup tables, one for the intensity abundance lookup, and the other for the incremental hop offset distance value lookup. It is necessary to include the two lookup table as dictionaries within the compressed output stream, because the actual code words are chosen for the sake of compression alone. For example, the most frequent intensity abundance or incremental hop offset distance values are usually replaced by the shortest code words in order to achieve high compression. At decompression time these code words must be translated back to the actual intensity abundance and incremental hop offset distance values. The translation is done by looking up the small dictionary and retrieving the actual values from the dictionary. For performance reasons, the small dictionary was implemented as a hash table lookup that can guarantee each lookup in a constant lookup time regardless of the dictionary size. The dictionary is usually small enough to keep entirely in memory during the operation.

In one implementation of this invention, one or more of dictionaries may be a local dictionary embedded into the compressed output stream, usually at or near the beginning of the stream. The advantage of having local dictionaries is that they are included with the compressed stream, thereby making the compressed stream self-sufficient and independent of any external information. Furthermore, since the local dictionaries are included with the compressed data, the content of the local dictionaries can be dynamically tailored for each data component, to achieve the best compression possible.

In another implementation of this invention, one or more of dictionaries may be a global dictionary. The advantage of global tables is that the same global dictionary can be shared across multiple compressed data. The global dictionaries are stored as separate resource entities within the compressed file, together with metadata information that identifies the global table type and reference ID number. For example, the global dictionary type may indicate an intensity abundance global dictionary type, or an incremental hop offset distance global dictionary type, or any other types as appropriate.

In yet another implementation of this invention, some of the compressed data may include one or more local dictionaries with the compressed data, and some of the compressed data may instead contain reference to one or more global dictionaries, uniquely identified by their global reference ID number.

The generation of global dictionaries is similar to the creation of a local dictionary, the main difference is that the global content is outputted as a resource, instead of being written to the compressed output stream, for use as a common resource across multiple compressed data records. The content of a global dictionary is added to the existing collection of global dictionaries (not shown in FIG. 8), and each added global dictionary is assigned a unique global reference ID number.

A local dictionary is included with the compressed output stream. In contrast, a global dictionary is treated as a global resource, which may be shared and re-used across multiple compressed data. In some embodiments there could be a set of global dictionaries which are references from inside the compressed data stream by their unique global reference ID number.

Encoder

Finally, the encoder (encoder component 880) collects, encodes, and streams all the necessary information into the compressed output stream 881. The encoder component begins by including the predictor 810 coefficients, and one or more local dictionaries, if any, at the beginning of the compressed output stream. If one or more global dictionaries are used instead of local dictionaries, the encoder includes the unique global reference ID number of each global table needed as a metadata record, instead of using the actual table. Although the included information may be placed anywhere within the compressed file, it is convenient to have the coefficients and local or global dictionary information at the beginning of the compressed file since this information is needed at decompression time. The encoder collects and packs the respective information into the compressed output stream. The encoder may also add validation information such as SHA or MD5 hash signatures to various objects of the compressed output stream in order to validate their integrity at decompression time. In one implementation of this invention, the user may specify the type of validation information to include, such as SHA or MD5 hash signatures. To check the data integrity, the SHA or MD5 hash can be computed on the compressed data and compared with the original signature on file. Any signature mismatch is a likely indication that the file has been modified from its original version.

After the encoder component 880 has completed the inclusion of all the necessary additional information at the beginning of the compressed output stream, the encoder component begins to encode the ordered sequence data into the compressed file. In order to achieve the best possible compression, the incremental data of each non-zero intensity peak, including the intensity abundance level as well as the incremental hop offset distance are compressed using arithmetic entropy coding, packed together, and the compressed data is outputted into the compressed stream, for each non-zero intensity peak of the sequence in turn.

In an exemplary implementation, in a first pass through the data, a predictor is fitted, the peaks and hop offsets are sorted by frequency of occurrences, dictionaries prepared, and lookup tables generated (in the form of a hash for guaranteed constant lookup time) for mapping y and hop values to code words. On a second pass through the data, the actual compression occurs, where code words for the second variable and hop values are written to the compressed output data. Preferably, only non-zero peaks are written to the output data (approximately 10% of x,y point in the typical mass spectrometry data set). For each peak the previously computed Y and hop offset are pulled, as well as the subsequent values to be compressed. Each pair of Y and hop values is looked up in the compression table above. If the outcome is a code word, the code word is retrieved and written to the compressed stream. In some cases a pair of Y and hop values may be taken together and encoded with a single code word (see above example of Y=20 followed by Y=31). If the next peak is the same (y, hop) as the current peak, a repeat sequence begins, which may be encoded as one code word or broken into a series of separate smaller repeats as illustrated above. Repeat words are like any other code words. In other words, the number of code words per peak may vary.

In one implementation of this invention, the encoder encodes the sequence of non-zero intensity peaks, one peak at a time. For each non-zero intensity peak in turn, the encoder component 880 retrieves, or re-computes if necessary, the reduced intensity level and incremental hop offset distance of that peak and proceeds to have them compressed and outputted to the compressed output stream. In a preferred implementation of this invention, the encoder may be an arithmetic entropy encoder that as a rule assigns the shortest code words to the most frequent occurring values. In other implementations of this invention, the encoder component may include any common type of encoder such as an entropy encoder, an arithmetic encoder, or any other type of encoder, including generally sub-optimal encoders such as Huffman encoders.

In yet another implementation of this invention, the encoder component may implement a preferred cluster encoding using arithmetic entropy encoding, which provides the highest compression at close to near optimum performance.

Regardless of the type of encoding algorithm implemented, the encoder component 880: (i) retrieves the reduced intensity level and incremental hop offset distance of one or more non-zero peaks, (ii) performs a calculation on the retrieved values, and (iii) proceeds to look up the appropriate code word in a code word dictionary, prepared in advance, using the result of the calculation in step (ii) as an index into the code word dictionary. Note that in the most general case the encoding may be applied to multiple non-zero peak values, aka symbols, at once. Note also that in some embodiments the calculation in step (ii) above may include looking up the value directly without modifying the retrieved value (s), the calculation being a NOP (no operation).

The code word dictionary is typically prepared at the beginning of the compression, based on the sorted frequency information of both the y intensity abundance levels and the incremental x hop offset distance from the components 830 and 860, respectively. The code word dictionary is typically used during compression and then discarded afterwards, only the inverse information necessary for decompression is retained as part of one or more local and or global dictionaries. In one implementation of this invention, the code word dictionary is implemented as a hash table for guaranteeing constant look up time during compression.

One attribute of arithmetic or entropy encoding is the use of variable length code words. In order to maximize the compression ratio, it is generally desirable to assign the shortest code words to the most frequently observed patterns and vice versa. Hence some code words are bound to be short while others are longer.

For high-speed compression throughput, it is often desirable to read and write units of fixed data width, since most DMA and memory access in modern computers is done based on a fixed word size (e.g., 32 or 64 bits, etc.). There is a performance penalty for extracting arbitrary number of bits from subsequent words and aligning the extracted bits together into a contiguous meaningful content.

In one implementation of this invention, the code word dictionary is designed to facilitate memory access on a fixed sub-word granularity. For example, in a preferred implementation of this invention, the code word dictionary is designed to access one byte (=8 bits) as the minimum unit of information, and further subsequently accessing every incremental increase by every either 4 (=nibble based) or 8 (=byte based) incremental bits. The reading and writing of whole bytes always being a primary mode of data streaming in any modern computer platform. The extra overhead associated with reading and writing a nibble (=half byte) is minimal as compared with arbitrary data width.

Figure 10:
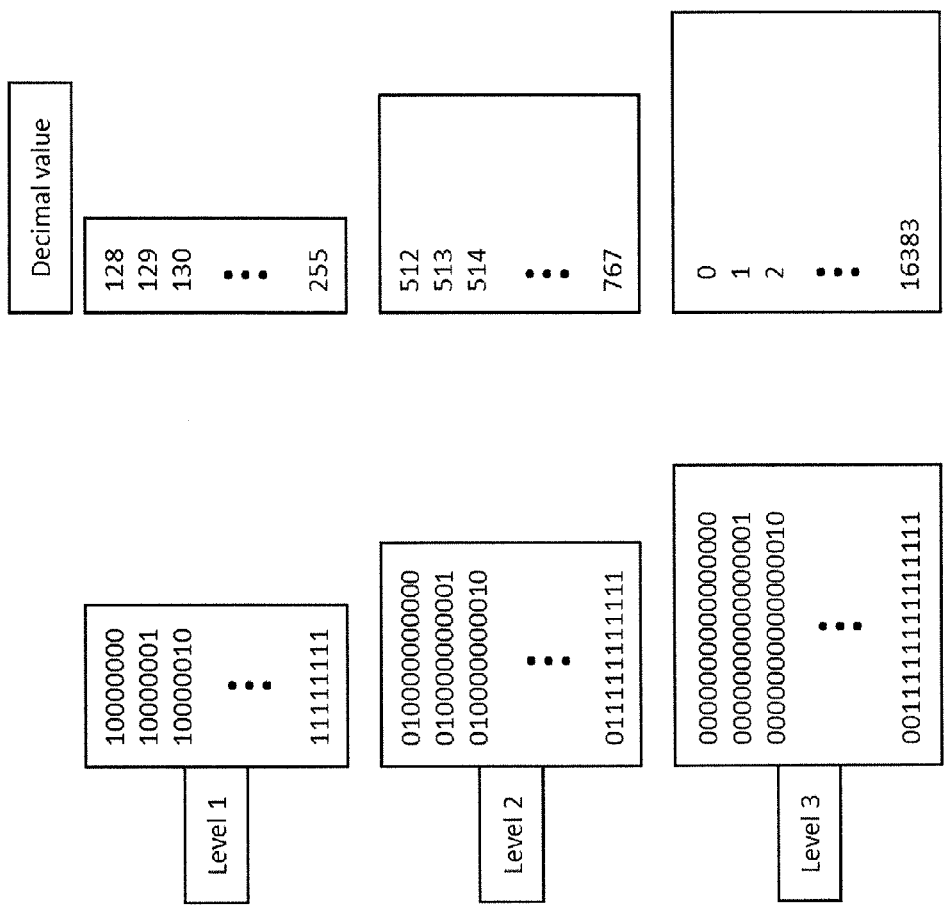
FIG. 10 provides an example of the creation of a unique 3-level code word dictionary. Level 1 contains up to 128 code words of length 8 bits. Level 2 contains up to 256 code words of length 12 bits, and level 3 contains 16384 code words of length 16 bits. The code words are designed to automatically self-inform the decoder of the length of each code word, such that the decoder can easily keep track of how many bytes to read from memory at any time.

FIG. 10 illustrates an example of creating a unique 3-level code word dictionary. Suppose there is a total of about 2000 distinct entries in the sequence of values to be compressed, be it the intensity abundance levels or the incremental hop offset distance values. The goal is to design a table of code words that allocates the shortest code words to the most frequent entries. One well known existing solution to the problem is to apply Huffman encoding based on the frequency of occurrence of each code word. However, in our case, there usually is a long tail of single occurrence instances, and the frequency values, in general, do not tend to approximate log powers of 2. In consequence, the resulting code words will tend to have a mixed set of code word lengths, some being extremely short, with just a few bits, while others may be very long, with long sequence of bits extending over multiple bytes. The handling of such extreme variability in code word length can have a detrimental impact on the throughput performance.

In one implementation of this invention, a preferred code word arrangement is used in order to obtain a balanced approach between the code word length variability and the need to use efficient fixed width data accesses to and from memory. Instead of using arbitrary unrestricted code word length, the proposed method limits the code word length in practice to be an even multiple of fixed granularity basis, such as every 4 or 8 bits for example. At the same time, the method allows to have groups of code words of variable length, called levels. One example of this approach is illustrated in FIG. 10. The code word dictionary includes 3 groups of code words, at 3 different levels. Level 1 code words are the shortest, comprised of 8 bits of data each, which is the minimum unit of width for efficient memory access, and is supported for streaming data on any platform. Since the first bit is reserved, set to the value of '1' for all the code words in level 1, this allows for up to 128 distinct code words of length 8, as shown in FIG. 10. The unsigned decimal value of each code word is given on the right hand side. If more than 128 code words are needed, a second group of level 2 code words is added. Each level 2 code word has a length of 12 bits. The top 2 bits of each code word are reserved and set to the value of '01'. There is room for additional 256 code words in level 2. If more than (128+256) code words are needed, a third group of level 3 code words is added. Each code word in level 3 has a length of 16 bits. The top two bits of each level 3 code word are set to '00', allowing for up to 16,384 code words in all. Thus in the example shown in FIG. 10, the 3-level dictionary may contain a total of up to (128+256+16384) code words. The shortest 128 level 1 code words are allocated to the most frequent values, followed by 256 medium length level 2 code words, and the remaining code words are assigned to level 3 code words.

It should be pointed out that the 3-level method shown in FIG. 10 is just one example, which could easily be extended by anyone skilled in the art to support additional levels and or adjust the number of code words per level and or use shorter or longer code word length per any particular level as desired.

Note that the reserved bit values at the beginning of each code word are purposely designed in order to automatically inform the decoder of the particular code word length at decompression time. Any code word that starts with the first bit value of '1' is an 8-bit long code word. Any code word that begins with a bit combination of '01' is a 12-bit long code word. Likewise, any code word that starts with the combination '00' is a 16-bit long code word. Therefore, the decoder can easily keep track of the number of bits to read at any given moment in time. The decoder simply reads the first byte and looks up the starting bit pattern. If the first byte starts with a '1', then this code word is 8 bits long and the decoder is done reading it. If, on the other hand, the first byte begins with a '01' or '00', then the decoder must read the subsequent byte, and the code word is 12 or 16 bits long, respectively. As can be appreciated, the decoder keeps efficiently reading one byte of data at any given time. In the case of a 12-bit long code word, the decoder may need to buffer up to 4 bits for the next cycle, which is a minimal overhead as compared with reading code words of arbitrary bit length.

The encoder component 880 reads in the sequence of non-zero intensity peaks, and for each non-zero peak, retrieves the intensity abundance level and incremental hop offset distance values, looks up the appropriate code word dictionary for each value, and outputs the code words to the compressed output stream 881. By taking advantage of the processing steps in accordance with this invention, an average compression ratio of 150:1 can be obtained at extremely high throughput rates. The decompression rate is even faster, due to the fact that it merely involves two hash table lookups, in guaranteed constant look up time, for each non-zero intensity peak, and the writing of the peak intensity to the appropriate buffer location. The performance and compression ratio achievable by this invention are orders of magnitude better than any other existing conventional compression method such as LZW, GZIP, ZLIB, BZIP2, Huffman or Deflate.

Hardware Implementation

The method of this invention may also be reduced to practice in a hardware implementation that may be encompassed in a Field Programmable Gate Array (FPGA) or a custom design Application Specific Integrated Circuit (ASIC), using existing libraries of standard components such as registers, adders, hash tables, etc. for the various components outlined in FIG. 8. The hardware implementation would have the advantage of being able to compress and decompress large mass spectrometry files at a much higher speeds and throughput rates than would otherwise be possible with a software implementation. The use of hardware implementation can therefore enable real-time compression decompression services at the native machine data acquisition throughput rate, without having to slow down occasionally or be forced to store all the data internally to a hard disk first.

Examples

Full working implementations of the proposed method of this invention have been written in both Java and Visual Studio C++. The method was validated against real data captured by several mass spectrometers, demonstrating an excellent average compression ratio of over 110:1 for representative profile mode files, in both lossless and practically lossless mode by using 13 significant digits of precision. The compression results demonstrated by the method of this invention are orders of magnitude better than what is otherwise possible to obtain with existing compression techniques.

In one case, a data set was obtained using a Bruker maXis HD, an ultra-high-resolution QTOF data-dependent tandem mass spectrometer in profile mode. The test molecule was a sample of purified human monoclonal antibody. The data set included 6,300 different (x,y) spectra, often referred to as scans. Each spectra is comprised of about 517,280 samples, that is, pairs of (x, y), with the index going from 0 to 517,279. The total number of peaks in any spectra varied from about 11,000 to about 70,000 non-zero peaks. A representative spectrum from this data set is illustrated in FIG. 2. The intensity/abundance values also varied considerably among the spectra within the full data set. The minimum intensity value was 0 and the maximum intensity was up to about 1,000,000. Zoomed sections of the representative spectra are illustrated in FIGS. 3 and 4, allowing one to view lower intensity peaks. The sampling was not uniform. The data starts with closely spaced samples for small m/z values and gradually increases the distance between samples as the m/z increases, in a non-linear fashion typical of Time of Flight (TOF) instruments, as illustrated in FIG. 5.

The compression in this case included a third-order polynomial predictor for predicting the x data. The type of predictor applied in this case is local predictor since the x data is different from one spectrum to the next.

The original data produced by the mass spectrometry device is comprised of a directory of files in a proprietary vendor format. The files contain the measurement data as well as metadata information about the various machine settings and calibration information. The proprietary vendor data was converted to standard mzML mass spectrometry data representation using ProteoWizard open source library tools, and then to ProteinMetrics byspec2 representation. The resulting uncompressed file size is 38,871,062,528 bytes (about 36.2 GB).

After applying compression in accordance with the preferred implementation described above, the resulting compressed file size is reduced to 329,625,640 bytes (314 MB). The resulting compression ratio is about 113:1 in this case. Moreover, the compression is such that the intensity compression is lossless, all Y intensity values are perfectly restored to their original values without error, and the X data mass accuracy is practically lossless, accurate to less than 13 significant digits (<0.000,000,01 Dalton) for any m/z measurement in the entire range of 200 to 3000 Dalton. The largest X error for any measurement point is guaranteed to be smaller than 1 E-8, and the average error is even smaller, since many measurements points have a smaller error. This level of accuracy is considered adequate for mass spectrometry proteomics identification for all practical purpose. Hence even though it is possible to make the x data compression lossless as well, the level of accuracy obtained is already adequate in practice, there is no need to make the compression entirely lossless.

For comparison, attempting the use of any of existing compression methods listed above, such as LZW, GZIP, ZLIB, BZIP2, or Deflate on the same mass spectrometry file produces much lower compression results overall.

It takes over an hour to compress the same file with the latest version of 7ZIP, a successor to the popular ZIP compression utility on Windows computers, on a high-end 3.4 GHz Windows PC using Intel i7-2600 processor with 8 GB of RAM, and the resulting file size is 17,381,050,954 bytes (16.1 GB). The resulting compression ratio is 2.24:1, the file size is only compressed in half.

Alternatively, applying standard GZIP compression, popular on Unix and Linux computers, to the same mass spectrometry file, in compress faster −1 kf mode, produces a compressed file size of Ser. No. 19/831,734,254 bytes (18.4 GB). The resulting compression ratio is only 1.96:1, even less than 7ZIP.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Terminology used herein is for the purpose of describing particular embodiments only and is not intended to be limiting of the invention. For example, as used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items and may be abbreviated as "/".

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

Although the terms "first" and "second" may be used herein to describe various features/elements (including steps), these features/elements should not be limited by these terms, unless the context indicates otherwise. These terms may be used to distinguish one feature/element from another feature/element. Thus, a first feature/element discussed below could be termed a second feature/element, and similarly, a second feature/element discussed below could be termed a first feature/element without departing from the teachings of the present invention.

Throughout this specification and the claims which follow, unless the context requires otherwise, the word "comprise", and variations such as "comprises" and "comprising" means various components can be co jointly employed in the methods and articles (e.g., compositions and apparatuses including device and methods). For example, the term "comprising" will be understood to imply the inclusion of any stated elements or steps but not the exclusion of any other elements or steps.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all subranges subsumed therein.

Although various illustrative embodiments are described above, any of a number of changes may be made to various embodiments without departing from the scope of the invention as described by the claims. For example, the order in which various described method steps are performed may often be changed in alternative embodiments, and in other alternative embodiments one or more method steps may be skipped altogether. Optional features of various device and system embodiments may be included in some embodiments and not in others. Therefore, the foregoing description is provided primarily for exemplary purposes and should not be interpreted to limit the scope of the invention as it is set forth in the claims.

The examples and illustrations included herein show, by way of illustration and not of limitation, specific embodiments in which the subject matter may be practiced. As mentioned, other embodiments may be utilized and derived there from, such that structural and logical substitutions and changes may be made without departing from the scope of this disclosure. Such embodiments of the inventive subject matter may be referred to herein individually or collectively by the teem "invention" merely for convenience and without intending to voluntarily limit the scope of this application to any single invention or inventive concept, if more than one is, in fact, disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A computer-implemented method of compressing a sparse multidimensional ordered series of spectroscopic data, the method comprising:
   a) receiving the sparse multidimensional ordered series data, wherein the data comprise indexed data sets, each indexed data set comprising an index (n), a first variable ($x_n$) representing a mass to charge ratio (m/z), and a second variable ($y_n$) representing signal intensity;
   b) defining a predictor that calculates each first variable ($x_n$) as a function of the index (n);
   c) assigning an amplitude code word to each $y_n$ based on the value and frequency of the $y_n$;
   d) calculating a hop offset value ($\Delta n$) for each $y_n$;
   e) assigning a hop code word to each $\Delta n$ based on the value and frequency of the $\Delta n$; and f) generating a compressed output, said compressed output comprising:
  i) a decoder legend comprising:
    a description of the predictor;
    a reverse amplitude code word dictionary associated with $y_n$; and
    a reverse hop code word dictionary associated with $\Delta n$; and
  ii) code word data comprising an amplitude code word and a hop code word for each $y_n$ and each $\Delta_n$, respectively.

2. The method of claim 1, wherein the sparse multidimensional ordered series data is in double precision floating point format.

3. The method of claim 1, wherein the multidimensional ordered series data contain values that fall within a dynamic range of less than 10 orders of magnitude.

4. The method of claim 1, wherein the sparse multidimensional ordered series data comprises a plurality of indexed x,y pairs.

5. The method of claim 1, wherein the predictor is a global predictor function.

6. The method of claim 5, wherein the global predictor is an $n^{th}$ order polynomial function.

7. The method of claim 6, wherein the function is $g(n)=a_0+a_1*n+a_2*n^2+a_3*n^3$.

8. The method of claim 1, wherein the predictor is a piecewise predictor.

9. The method of claim 1, wherein the predictor is a local predictor.

10. The method claim 1, wherein the predictor further comprises an error correction mechanism.

11. The method of claim 1, wherein the second variable $y_n$ data is comprised of a sequence of variable amplitude measurements interspaced with intervals of relatively quiet periods during which the $y_n$ data remains moderately constant and primarily dominated by noise.

12. The method of claim 1, wherein the second variable $y_n$ data is comprised of a non-uniform multi-modal distribution of amplitude ranges, where certain amplitude ranges that occur frequently are interspaced with other amplitude ranges that occur much less frequently.

13. The method of claim 12, wherein the second variable $y_n$ data is comprised of a discrete set of observable amplitude ranges interspaced with intervals of amplitude ranges that are not observed in the data.

14. The method of claim 1, wherein assigning an amplitude code word to each $y_n$ based on the value and frequency of the $y_n$ comprises:
  i) generating a hash table for amplitude values;
  ii) looking up each of the second variable ($y_n$) value in turn, wherein if the $y_n$ value is not previously seen, then the $y_n$ value is added to a list of amplitude values and an associated frequency occurrence is set to one, and wherein if the $y_n$ is already present on the list of amplitude values, then the associated frequency occurrence is incremented by one;
  iii) sorting the list of amplitude values by their associated frequency occurrence;
  iv) assigning a unique amplitude code word to each unique amplitude value in the list of amplitude values, wherein the shortest code words are assigned to the most frequently occurring amplitude values.

15. The method of claim 14, wherein any second variable ($y_n$) value less than or equal to a baseline threshold is skipped.

16. The method of claim 1, wherein the sparse multidimensional ordered series data describe a non-uniform multi-modal distribution of hop $\Delta_n$ ranges, where certain hop ranges that are frequently and considerably more likely to occur are interspaced with other hop ranges that are much less likely to occur.

17. The method of claim 16, wherein the hop offset values are comprised of a discrete set of observable amplitude ranges interspaced with intervals of amplitude ranges that are not observed in the data.

18. The method of claim 1, wherein calculating a hop offset value ($\Delta_n$) for each $y_n$ comprises:
  i) identifying an initial hop offset value ($\Delta_0$) and entering the $\Delta_0$ into a previous register as a previous peak location;
  ii) feeding each index (n) into the previous register subtracting the previous peak location from the index (n) to calculate the hop offset value ($\Delta_n$) and then replacing the previous peak location with the index (n);
  iii) repeating step ii) for each index (n) in the sparse multidimensional ordered series data.

19. The method of claim 1, wherein calculating a hop offset value ($\Delta_n$) for each $y_n$ comprises:
  i) identifying an initial hop offset value ($\Delta_0$) and entering the $\Delta_0$ into a previous register as a previous peak location;
  ii) feeding each first variable ($x_n$) value into the previous register subtracting the previous peak location from the first variable ($x_n$) value to calculate the hop offset value ($\Delta_n$) and then replacing the previous peak location with the first variable ($x_n$) value;
  iii) repeating step ii) for each first variable ($x_n$) value in the sparse multidimensional ordered series data.

20. The method of claim 1, wherein assigning a hop code word to each $\Delta n$ based on the value and frequency of the $\Delta_n$ comprises:
  i) generating a hash table for hop offset values;
  ii) looking up each hop offset value ($\Delta n$) value in turn, wherein if the $\Delta_n$ value is not previously seen, then the $\Delta_n$ value is added to a list of hop values and an associated frequency occurrence is set to one, and wherein if the $\Delta_n$ is already present on the list of hop values, then the associated frequency occurrence is incremented by one;
  iii) sorting the list of hop values by their associated frequency occurrence;
  iv) assigning a unique hop code word to each unique hop value in the list of hop values, wherein the shortest code words are assigned to the most frequently occurring hop values.

21. A non-transitory computer readable medium having instructions stored therein, which, when executed by a process, cause the processor to perform operations, the operations comprising:
  receiving sparse multidimensional ordered series data, wherein the data comprise indexed data sets, each indexed data set comprising an index (n), a first variable ($x_n$) and a second variable ($y_n$);
  defining a predictor that calculates each first variable ($x_{11}$) as a function of the index (n);
  assigning an amplitude code word to each $y_n$ based on the value and frequency of the $y_n$;
  calculating a hop value ($\Delta n$) for each $y_n$ and assigning a hop code word to each $\Delta_n$ based on the value and frequency of the $\Delta n$; and
  generating a compressed output, said compressed output comprising:
    a decoder legend comprising:
      a description of the predictor;

a reverse amplitude code word dictionary associated with $y_n$; and a reverse hop code word dictionary associated with $\Delta_n$; and code word data comprising an amplitude code word and a hop code word for each $y_n$ and each $\Delta n$, respectively.

22. An ordered series data encoder comprising a data receiver for receiving sparse multidimensional ordered series data, wherein the data comprise indexed data sets, each indexed data set comprising an index (n), a first variable ($x_n$) and a second variable ($y_n$);

a predictor that predicts each first variable ($x_n$) as a function of the index (n);

an amplitude coder that assigns an amplitude code word to each $y_n$ based on the value and frequency of the $y_n$;

a hop coder that calculates a hop value ($\Delta_n$) for each $y_n$ and assigns a hop code word to each $\Delta n$ based on the value and frequency of the $\Delta_n$; and an encoder that generates a compressed output, said compressed output comprising:
  a decoder legend comprising:
    a description of the predictor;
    a reverse amplitude code word dictionary associated with $y_n$; and
    a reverse hop code word dictionary associated with $\Delta_n$; and
  code word data comprising an amplitude code word and a hop code word for each $y_n$ and each $\Delta n$, respectively.

23. The ordered series encoder of claim 22, wherein the ordered series is a time series.

24. A non-transitory readable medium comprising compressed sparse multidimensional ordered series data, said compressed data comprising:
  a decoder legend comprising:
    a description of a predictor, wherein the predictor calculates a first variable ($x_n$) as a function of an index (n);
    a reverse amplitude dictionary, wherein the reverse amplitude dictionary includes a plurality of amplitude code words, wherein each amplitude code word is associated with an amplitude value; and
    a reverse hop offset dictionary, wherein the reverse hop offset dictionary associates a hop code word to each $\Delta_n$ based on the value and frequency of the $\Delta_n$; and
  code word data comprising a plurality of pairs of an amplitude code word and a hop code word,
wherein each pair of an amplitude code word and a hop code word, is capable of being decompressed to an index (n), a first variable ($x_n$) and a second variable ($y_n$).

25. The non-transitory medium of claim 24, wherein the decoder legend further comprises an initial hop offset value ($\Delta_0$).

* * * * *